US012413002B2

(12) United States Patent
Oosaka

(10) Patent No.: US 12,413,002 B2
(45) Date of Patent: Sep. 9, 2025

(54) ELECTRIC CONNECTOR AND BOARD ASSEMBLY

(71) Applicant: Japan Aviation Electronics Industry, Ltd., Tokyo (JP)

(72) Inventor: Junji Oosaka, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 386 days.

(21) Appl. No.: 17/936,542

(22) Filed: Sep. 29, 2022

(65) Prior Publication Data

US 2023/0163505 A1    May 25, 2023

(30) Foreign Application Priority Data

Nov. 19, 2021   (JP) ................. 2021-188483

(51) Int. Cl.
*H01R 13/24*    (2006.01)
*H01R 12/57*    (2011.01)
*H01R 12/71*    (2011.01)
*H01R 13/41*    (2006.01)
*H05K 1/02*     (2006.01)
*H05K 1/18*     (2006.01)

(52) U.S. Cl.
CPC ......... *H01R 13/2407* (2013.01); *H01R 12/57* (2013.01); *H01R 12/716* (2013.01); *H01R 13/41* (2013.01); *H05K 1/0213* (2013.01); *H05K 1/181* (2013.01); *H05K 2201/10189* (2013.01)

(58) Field of Classification Search
None
See application file for complete search history.

(56) References Cited

U.S. PATENT DOCUMENTS

| 6,298,552 | B1  | 10/2001 | Li |
| 9,614,313 | B2* | 4/2017  | Mikawa ............. H01R 13/2428 |
| 2019/0190167 | A1 | 6/2019 | Choi et al. |
| 2021/0280999 | A1 | 9/2021 | Horii |
| 2021/0305733 | A1 | 9/2021 | Oosaka et al. |

(Continued)

FOREIGN PATENT DOCUMENTS

| CN | 1134869 C | 1/2004 |
| JP | 3107602 U | 2/2005 |

(Continued)

OTHER PUBLICATIONS

Taiwanese Office Action in counterpart Taiwan Application No. 111139541 issued on Sep. 20, 2023, with English Machine Translation.

(Continued)

*Primary Examiner* — Ross N Gushi
(74) *Attorney, Agent, or Firm* — Renner, Otto, Boisselle & Sklar, LLP

(57) ABSTRACT

When an upper contact part is not in contact with a signal pad, a lower contact part is not in contact with a short-circuiting pad, and when the upper contact part comes into contact with the signal pad and an elastic deformation part is elastically deformed, the lower contact part comes into contact with the short-circuiting pad. The current path length from the upper contact part to the lower contact part is shorter than the current path length from the upper contact part to a soldering part.

9 Claims, 19 Drawing Sheets

(56) References Cited

U.S. PATENT DOCUMENTS

2022/0037818 A1   2/2022   Oosaka et al.

FOREIGN PATENT DOCUMENTS

JP           6901603  B1    7/2021
JP         2021140953 A     9/2021

OTHER PUBLICATIONS

Japanese Office Action in counterpart Japan Application No. 2021-188483 issued on Apr. 8, 2025 with English Machine Translation.
Japanese Office Action in counterpart Japan Application No. 2021-188483 issued on Jul. 8, 2025 with English Machine Translation.

* cited by examiner

ELECTRIC CONNECTOR AND BOARD ASSEMBLY

INCORPORATION BY REFERENCE

This application is based upon and claims the benefit of priority from Japanese patent application No. 2021-188483, filed on Nov. 19, 2021, the disclosure of which is incorporated herein in its entirety by reference.

BACKGROUND

The present disclosure relates to an electric connector and a board assembly.

As shown in FIG. 19 of the present application, Patent Literature 1 (Japanese Patent No. 6901603) discloses a board-to-board connector 101 in which a plurality of contacts 100 are arranged in a row.

SUMMARY

As the current path length of a contact is shorter, the resistance value in this current path is smaller. However, reducing the current path length of a contact directly causes the contact to harden, which degrades the connection reliability.

One of the objects of the present disclosure is to provide a technique of reducing the current path length without degrading the connection reliability of a contact.

According to an aspect of the present disclosure, there is provided an electric connector including a housing and a plurality of contacts held by the housing. The plurality of contacts electrically connect a plurality of first conductors provided on an object and a plurality of second conductors provided on a board, respectively. At least one contact of the plurality of contacts includes a fixed part to be fixed to the housing, a soldering part to be soldered to a corresponding second conductor and an elastic deformation part being a cantilever extending from the fixed part. The elastic deformation part includes a first contact part configured to come into contact with a corresponding first conductor; and a second contact part configured to come into contact with a third conductor provided on the board, the third conductor being at the same potential as the second conductor. When the first contact part is not in contact with the first conductor, the second contact part is not in contact with the third conductor, and when the first contact part comes into contact with the first conductor and the elastic deformation part is elastically deformed, the second contact part comes into contact with the third conductor. A current path length from the first contact part to the second contact part is shorter than a current path length from the first contact part to the soldering part.

According to the present disclosure, the current path length is reduced without degrading the connection reliability of a contact.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
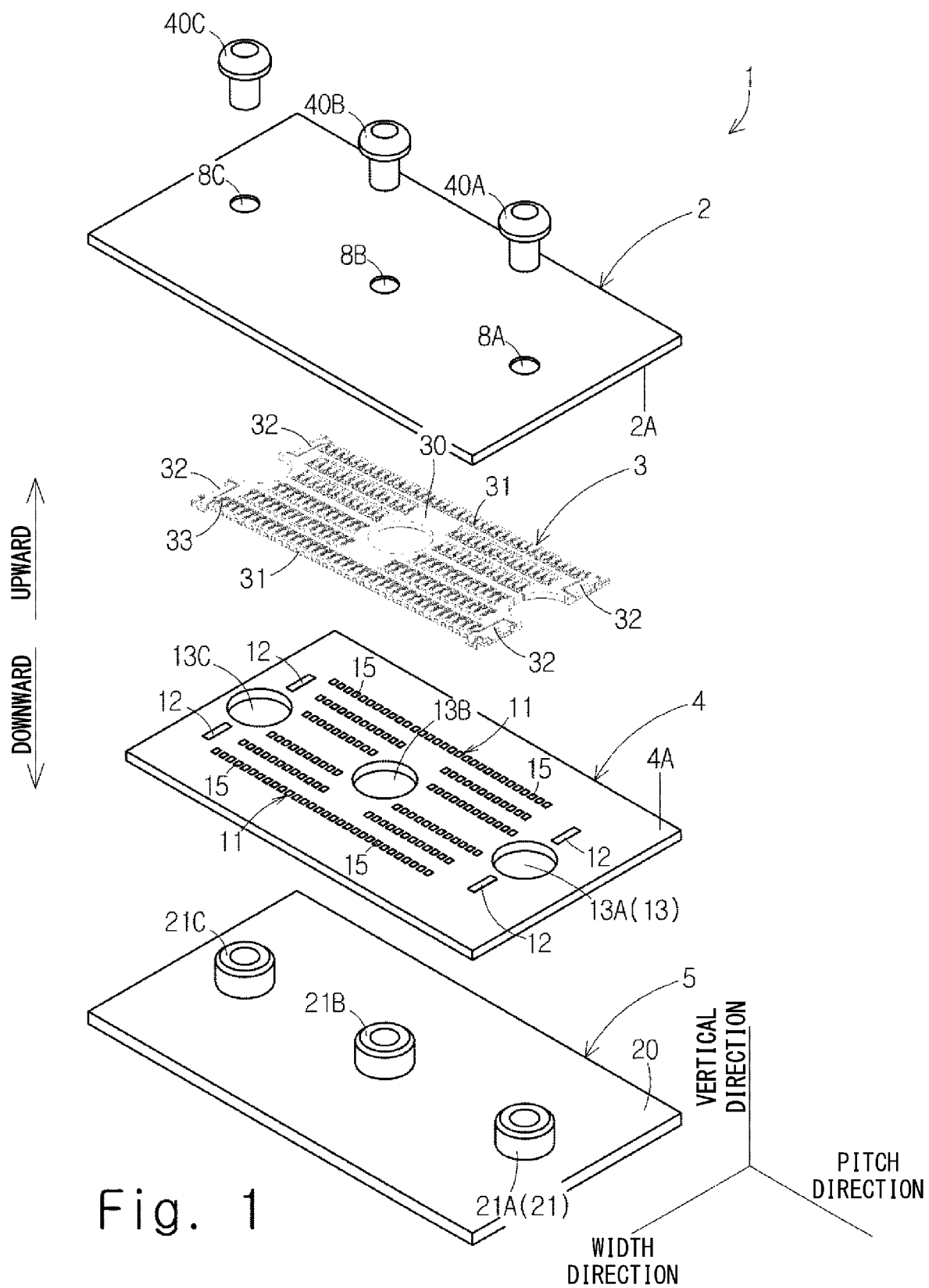
FIG. 1 is an exploded perspective view of an information processing device (first embodiment)

A first embodiment of the present disclosure will be described hereinafter with reference to FIGS. 1 to 13. FIG. 1 is an exploded perspective view of an information processing device 1 (electronic device). As shown in FIG. 1, the information processing device 1 includes a CPU board 2 (first board; object), a connector 3, an input-output board 4 (second board; board), and a support board 5. The CPU board 2, the connector 3, the input-output board 4, and the support board 5 are placed on top of one another in this recited order. Specifically, the connector 3 is disposed between the CPU board 2 and the input-output board 4.

The CPU board 2 and the input-output board 4 are rigid boards such as a paper phenolic board or a glass epoxy board, for example.

Figure 2:
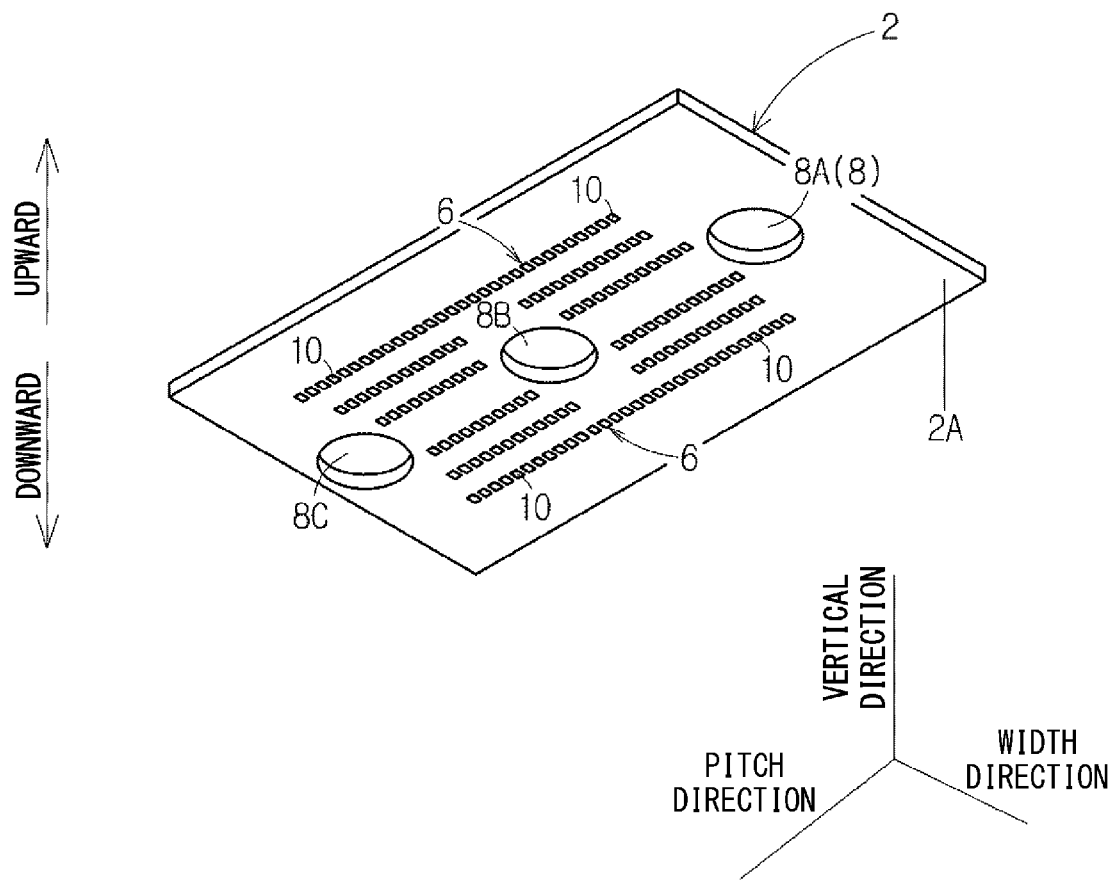
FIG. 2 is a perspective view of a CPU board when viewed from another angle (first embodiment)

FIG. 2 is a perspective view of the CPU board 2 when viewed from another angle. As shown in FIGS. 1 and 2, the CPU board 2 includes a connector opposed surface 2A to be opposed to the connector 3. As shown in FIG. 2, a plurality of signal pad rows 6 are formed on the connector opposed surface 2A. Further, the CPU board 2 has a plurality of bolt fastening holes 8.

The plurality of signal pad rows 6 extend parallel to one another. Each of the signal pad rows 6 includes a plurality of signal pads 10 (first conductor). The longitudinal direction of each signal pad row 6 is referred to as a pitch direction. Further, the direction orthogonal to the pitch direction is defined as a width direction. The plurality of signal pad rows 6 are arranged in the width direction. The thickness direction of the CPU board 2 is orthogonal to the pitch direction and the width direction, and it is referred to hereinafter as a vertical direction. The vertical direction includes downward which the connector opposed surface 2A faces, and upward opposite to downward. Note that the vertical direction, the upward direction, and the downward direction are directions used by way of illustration only and should not be interpreted as limiting the position of the information processing device 1 and the connector 3 when they are actually used.

The plurality of bolt fastening holes 8 are disposed separately from each other in the pitch direction. The plurality of bolt fastening holes 8 include a first bolt fastening hole 8A, a second bolt fastening hole 8B, and a third bolt fastening hole 8C. The first bolt fastening hole 8A, the second bolt fastening hole 8B, and the third bolt fastening hole 8C are arranged in this recited order.

Referring back to FIG. 1, the input-output board 4 includes a connector opposed surface 4A to be opposed to the connector 3. A plurality of signal pad rows 11 and a plurality of hold-down pads 12 are formed on the connector opposed surface 4A. Further, the input-output board 4 has a plurality of bolt fastening holes 13.

The plurality of signal pad rows 11 extend parallel to one another. The plurality of signal pad rows 11 are arranged in the width direction. Each of the signal pad rows 11 includes a plurality of signal pads 15 (second conductor).

The plurality of bolt fastening holes 13 are disposed separately from each other in the pitch direction. The plurality of bolt fastening holes 13 include a first bolt fastening hole 13A, a second bolt fastening hole 13B, and a third bolt fastening hole 13C. The first bolt fastening hole 13A, the second bolt fastening hole 13B, and the third bolt fastening hole 13C are arranged in this recited order.

The support board 5 is typically a part of a casing that accommodates the CPU board 2, the connector 3, and the input-output board 4, and it is made of aluminum or aluminum alloy, for example. The support board 5 includes a flat-plate board main body 20, and a plurality of nuts 21. The plurality of nuts 21 project upward from the board main body 20.

The plurality of nuts 21 include a first nut 21A, a second nut 21B, and a third nut 21C. The first nut 21A, the second nut 21B, and the third nut 21C are disposed to correspond to the first bolt fastening hole 13A, the second bolt fastening hole 13B, and the third bolt fastening hole 13C of the input-output board 4, respectively.

Figure 3:
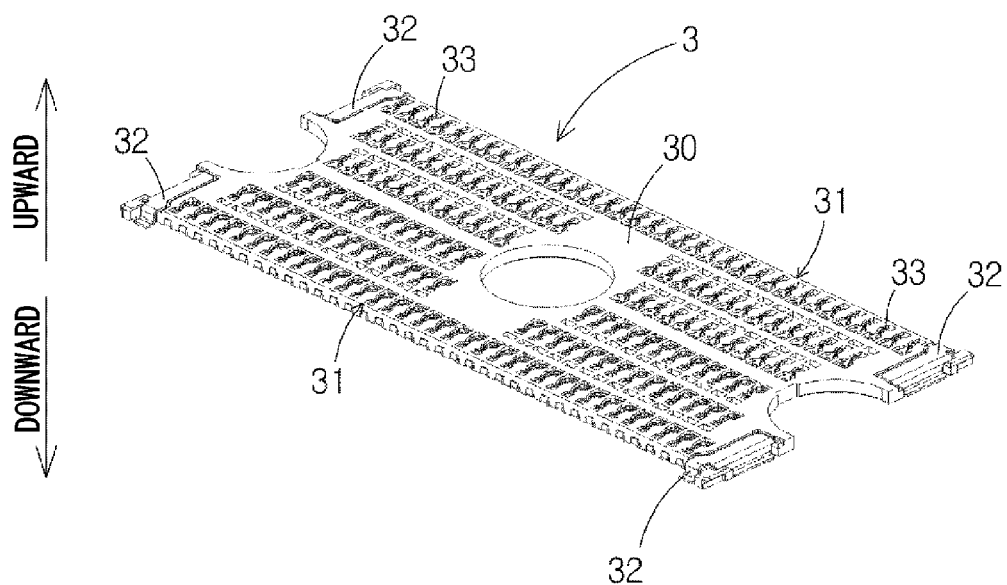
FIG. 3 is a perspective view of a connector (first embodiment)
Figure 3:
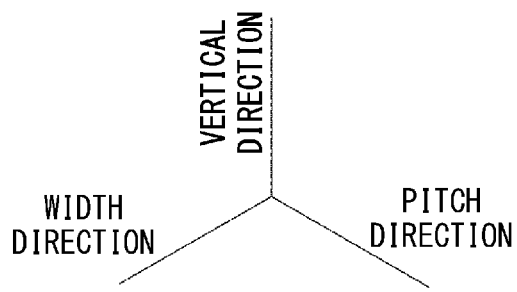
Figure 4:
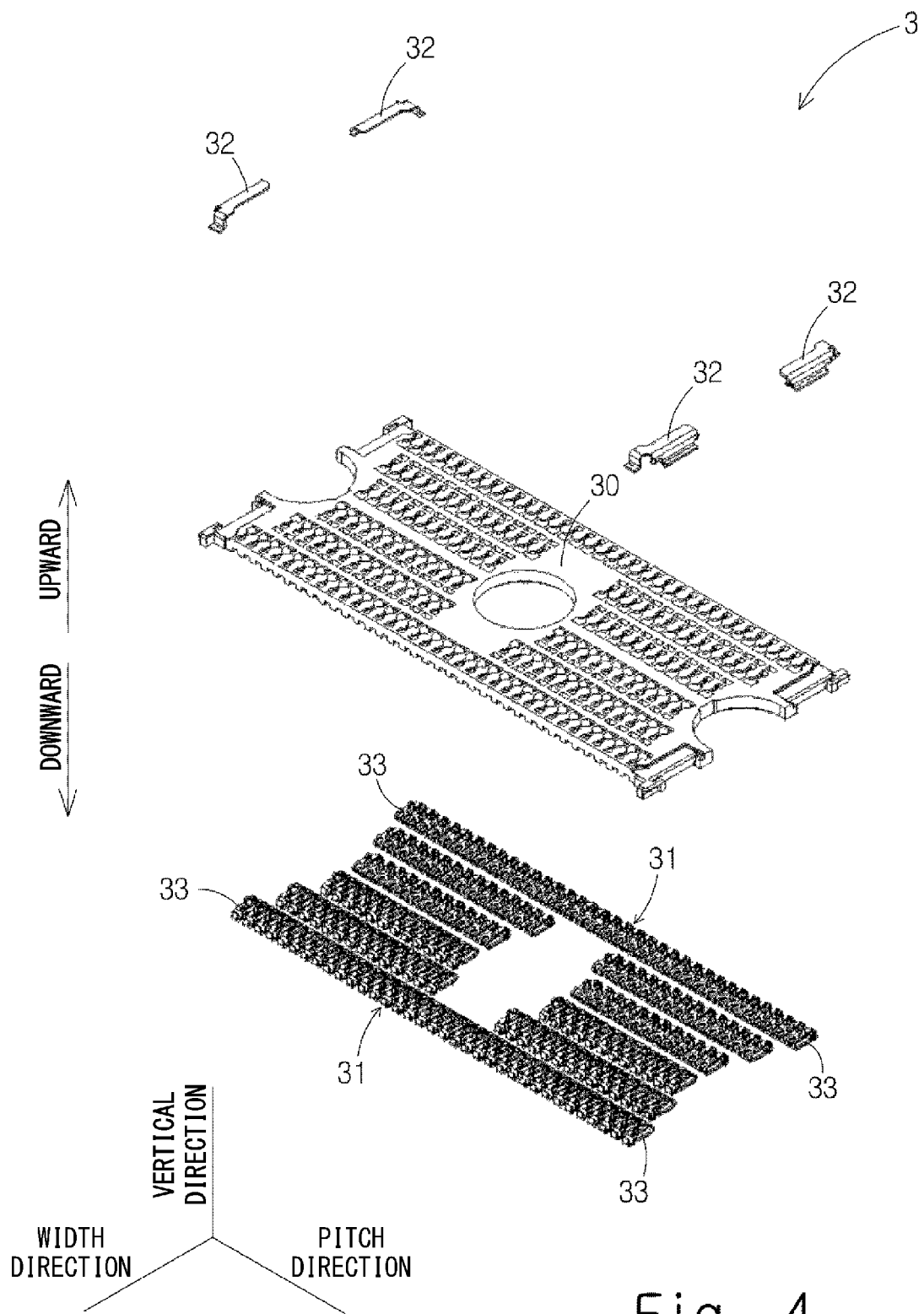
FIG. 4 is an exploded perspective view of the connector (first embodiment)

The connector 3 is mountable on the connector opposed surface 4A of the input-output board 4. FIG. 3 is a perspective view of the connector 3. FIG. 4 is an exploded perspective view of the connector 3. As shown in FIGS. 3 and 4, the connector 3 includes a rectangular flat-plate housing 30 made of insulating resin, a plurality of contact rows 31, and a plurality of hold-downs 32. The plurality of contact rows 31 and the plurality of hold-downs 32 are held on the housing 30.

The plurality of contact rows 31 extend parallel to one another. The plurality of contact rows 31 are arranged in the width direction. Each contact row 31 extends linearly in the pitch direction. Each contact row 31 includes a plurality of contacts 33. Each contact 33 is conductive and formed by punching and bending a metal plate formed by plating copper or copper alloy, for example. The plurality of contacts 33 include signal contacts for differential transmission and ground contacts. The signal contact for differential transmission means a signal contact to be used for differential transmission.

As shown in FIG. 1, the plurality of hold-downs 32 are disposed to correspond to the plurality of hold-down pads 12 of the input-output board 4, respectively. Each hold-down 32 is formed by punching and bending a metal plate such as a stainless steel plate, for example.

Figure 5:
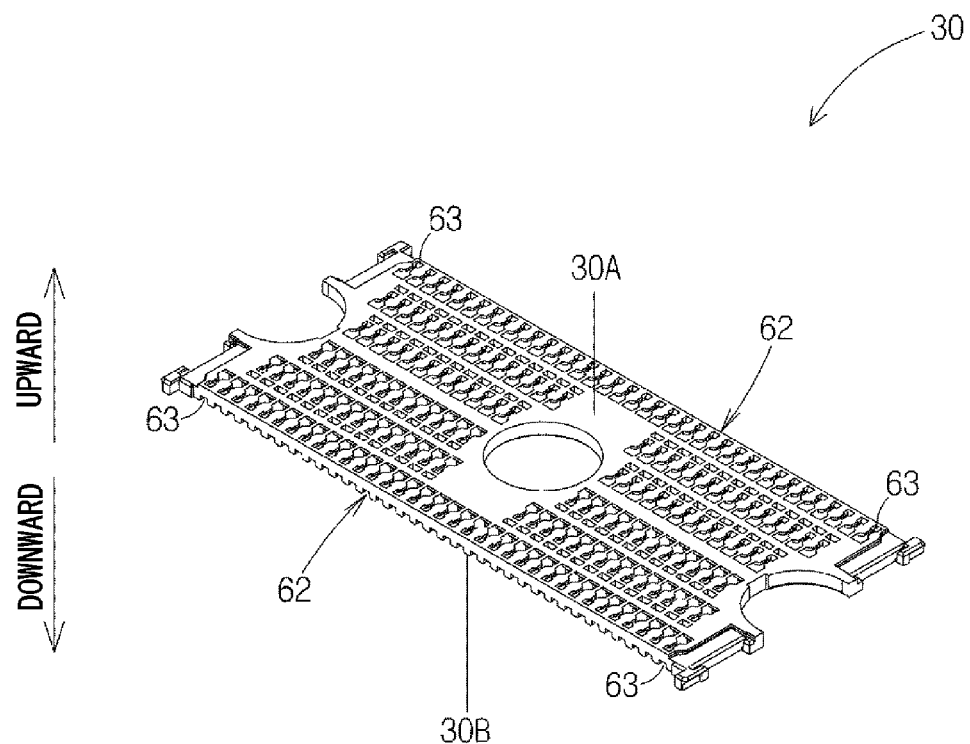
FIG. 5 is a perspective view of a housing (first embodiment)
Figure 5:
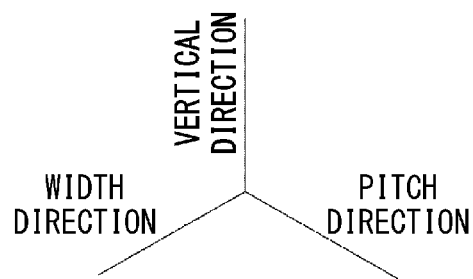

FIG. 5 is a perspective view of the housing 30. As shown in FIG. 5, the housing 30 includes a CPU board opposed surface 30A serving as a housing upper surface that can be opposed to the CPU board 2 by facing upward, and an input-output board opposed surface 30B serving as a housing lower surface that can be opposed to the input-output board 4 by facing downward. The CPU board opposed surface 30A is the uppermost surface of the housing 30. The input-output board opposed surface 30B is the lowermost surface of the housing 30.

Referring back to FIG. 1, the overview of the assembly procedure of the information processing device 1 is described.

First, the connector 3 is mounted on the input-output board 4. To be specific, the plurality of contact rows 31 are respectively soldered to the plurality of signal pad rows 11, and further the plurality of hold-downs 32 are respectively soldered to the plurality of hold-down pads 12.

Next, the input-output board 4 on which the connector 3 is mounted is placed on the support board 5. At this time, the first nut 21A, the second nut 21B, and the third nut 21C of the support board 5 penetrate the first bolt fastening hole 13A, the second bolt fastening hole 13B, and the third bolt fastening hole 13C of the input-output board 4, respectively.

Then, the CPU board 2 is attached to the support board 5 in such a way that the CPU board 2 overlaps the connector 3. To be specific, a first bolt 40A is fastened to the first nut 21A through the first bolt fastening hole 8A and the first bolt fastening hole 13A, a second bolt 40B is fastened to the second nut 21B through the second bolt fastening hole 8B and the second bolt fastening hole 13B, and a third bolt 40C is fastened to the third nut 21C through the third bolt fastening hole 8C and the third bolt fastening hole 13C. In this manner, the connector 3 is interposed between the CPU board 2 and the input-output board 4, and thereby the plurality of signal pads 15 of the input-output board 4 and the plurality of signal pads 10 of the CPU board 2 shown in FIG. 2 are respectively electrically connected to each other through the plurality of contacts 33 of the connector 3.

The connector 3 according to this embodiment is designed for high-speed transmission, and the assumed frequency of a signal flowing through each contact 33 is from 10 GHz to 25 GHz. In one example, the connector 3 may be a connector for differential transmission.

The connector 3 is described hereinafter in further detail.

As shown in FIG. 5, the housing 30 is formed in a rectangular flat-plate shape. A plurality of contact accommodation rows 62 are formed in the housing 30. The plurality of contact accommodation rows 62 extend parallel to one another. Each contact accommodation row 62 extends linearly in the pitch direction. The plurality of contact accommodation rows 62 are arranged in the width direction. Each contact accommodation row 62 includes a plurality of contact accommodation parts 63.

Figure 6:
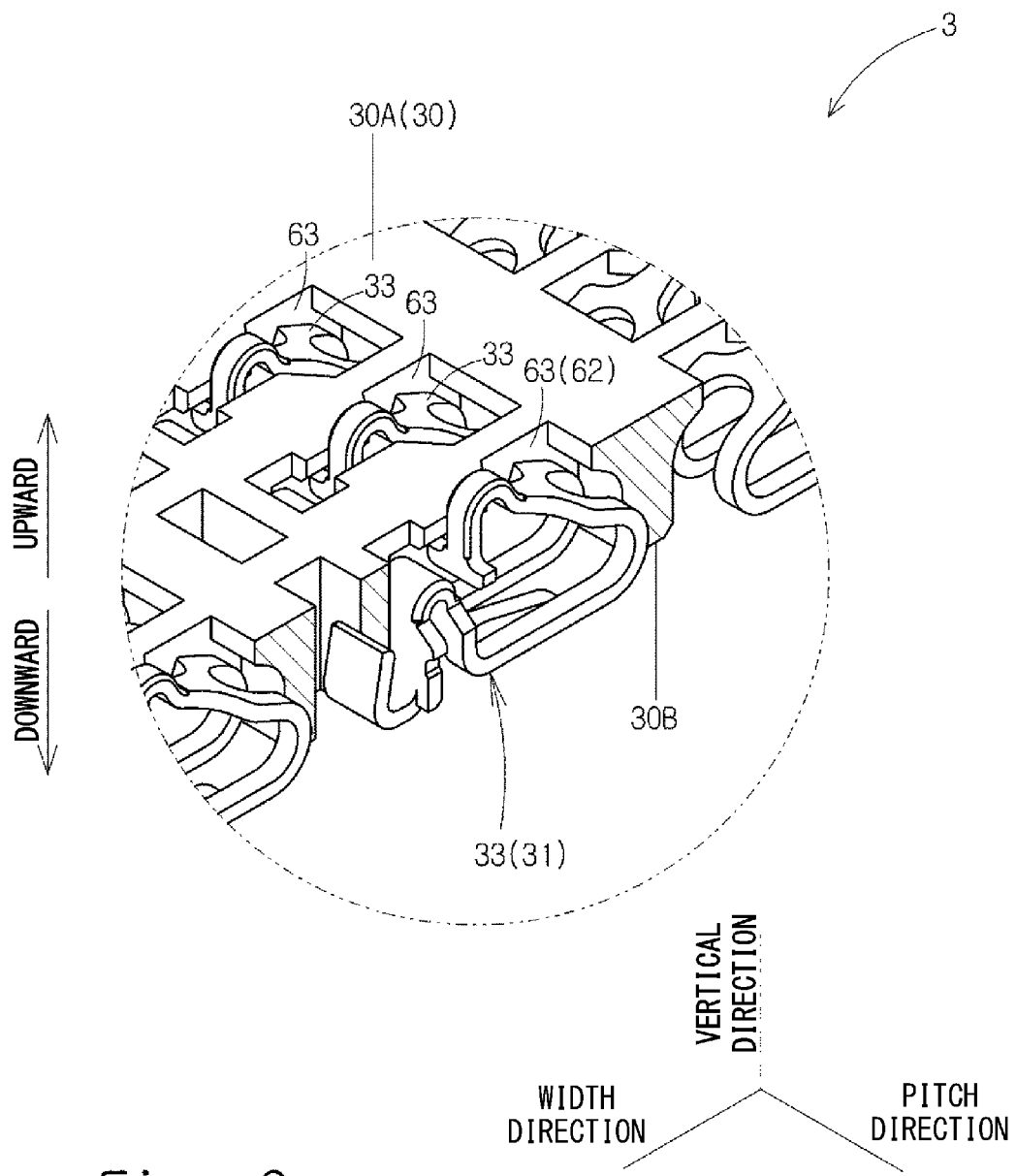
FIG. 6 is a partially cutout perspective view of the connector (first embodiment)
Figure 7:
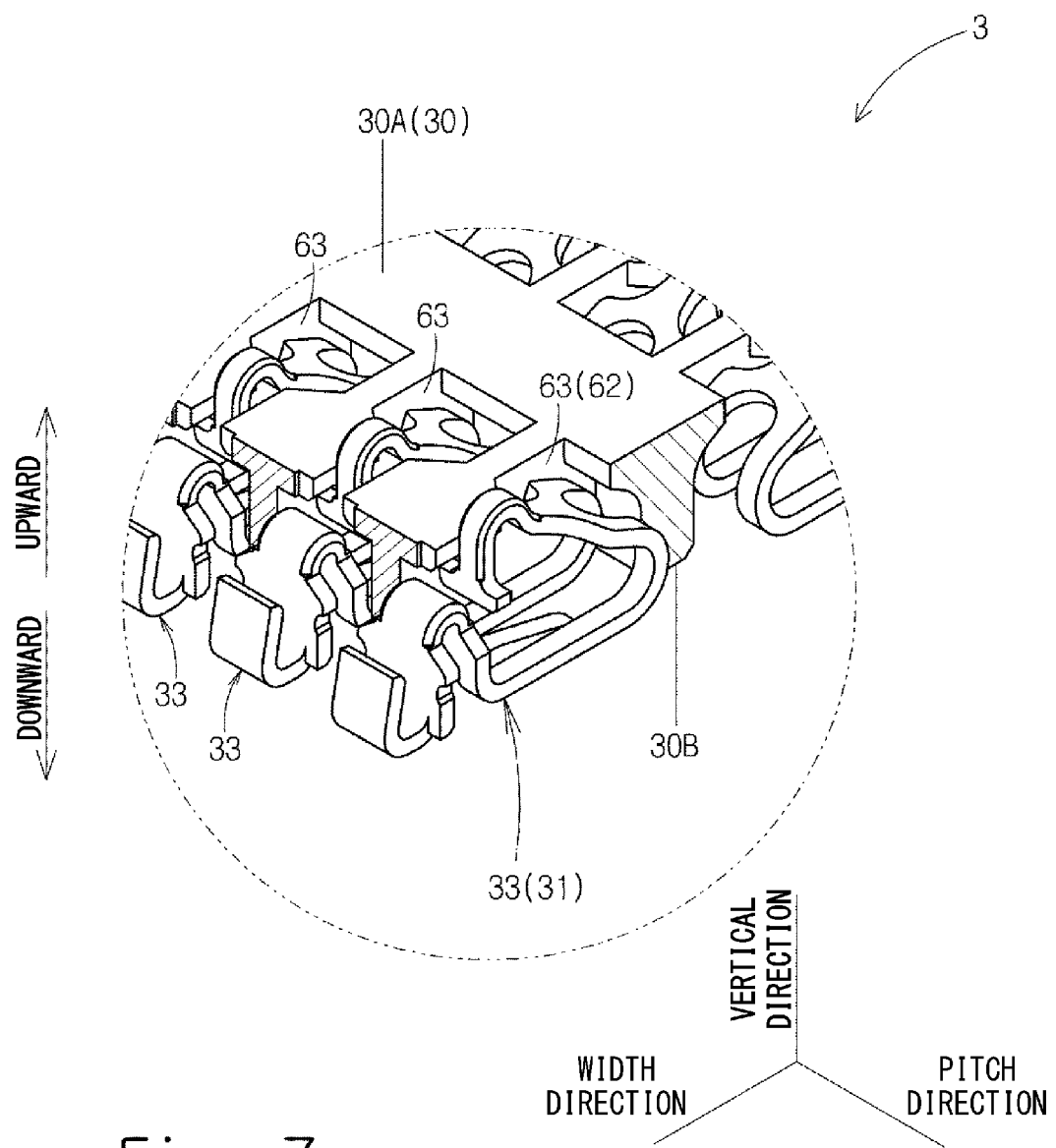
FIG. 7 is a partially cutout perspective view of the connector (first embodiment)
Figure 8:
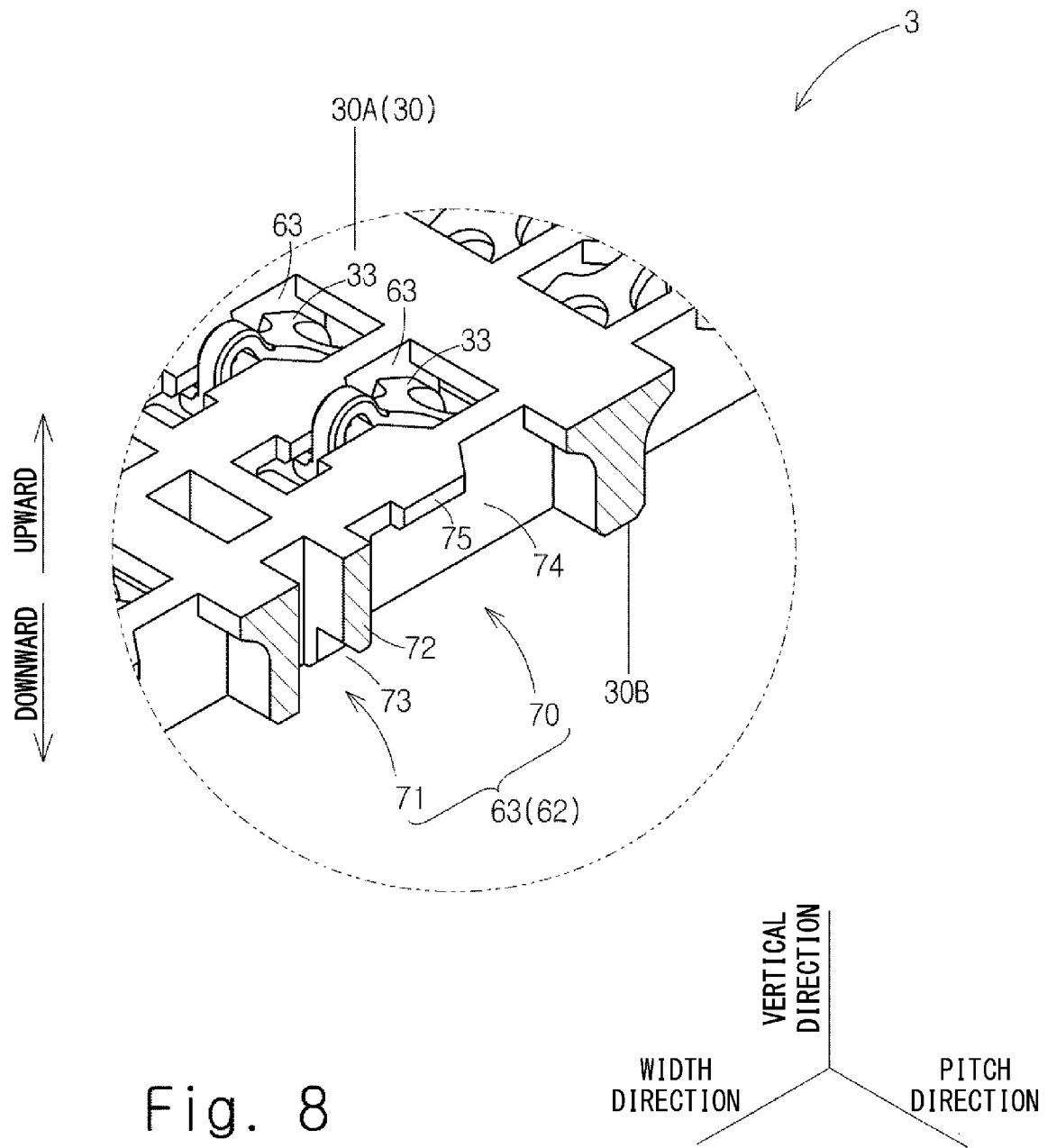
FIG. 8 is a partially cutout perspective view of the connector (first embodiment)
Figure 9:
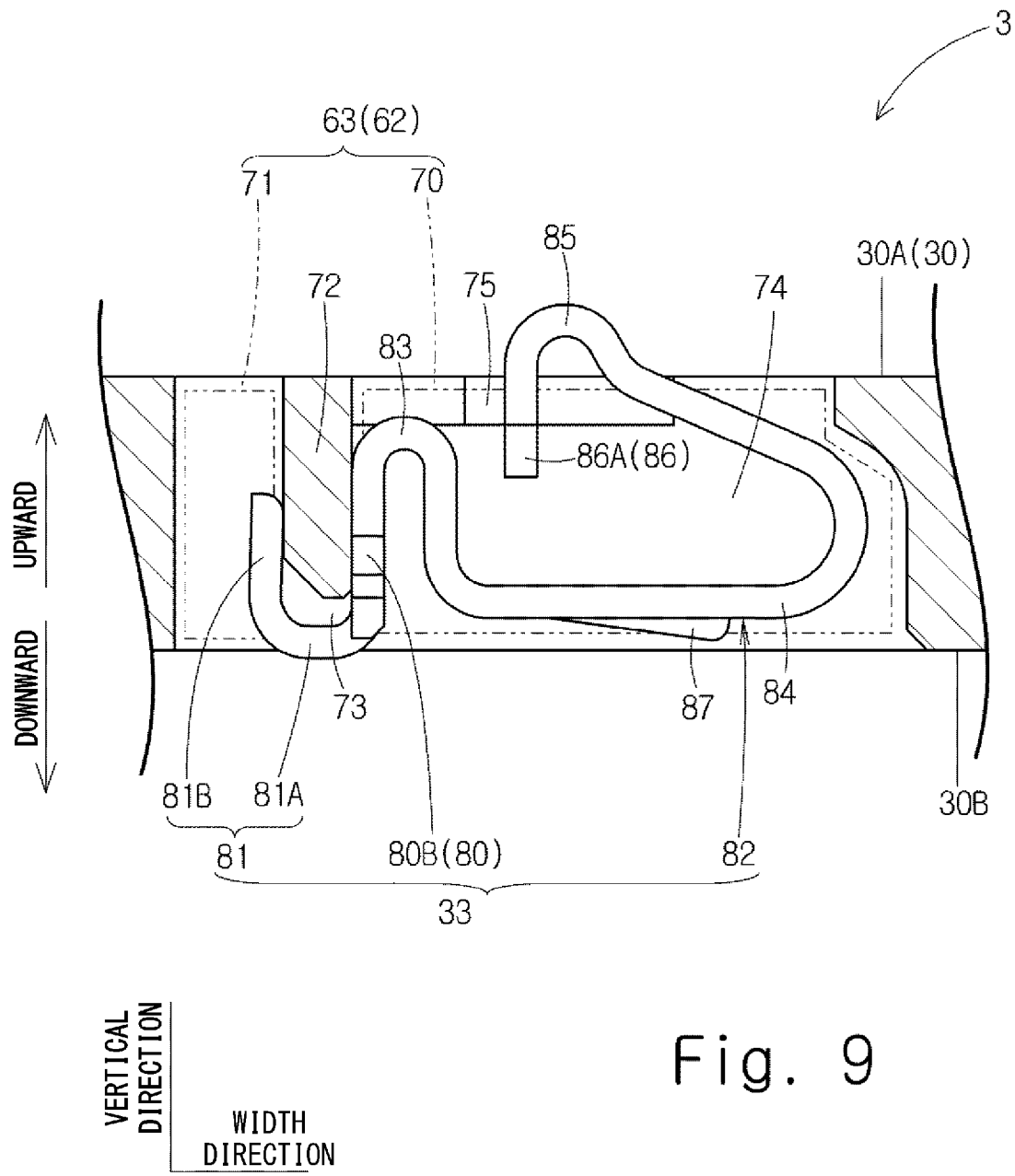
FIG. 9 is a cross-sectional view of the connector corresponding to FIG. 6 (first embodiment)

FIG. 6 is a partially cutout perspective view of the connector 3 where the housing 30 is cut along a plane orthogonal to the pitch direction. FIG. 7 is a partially cutout perspective view of the connector 3 where the housing 30 is cut along a plane orthogonal to the pitch direction and a plane orthogonal to the width direction. FIG. 8 is a partially cutout perspective view of the connector 3 where the housing 30 is cut along a plane orthogonal to the pitch direction. FIG. 9 is a cross-sectional view of the connector 3 where the housing 30 is cut along a plane orthogonal to the pitch direction.

As shown in FIGS. 6 and 7, the plurality of contact accommodation rows 62 accommodate the plurality of contact rows 31, respectively. In other words, the plurality of contact accommodation parts 63 accommodate the plurality of contacts 33, respectively. Each contact accommodation part 63 is formed to attach each contact 33 to the housing 30. As shown in FIG. 8, each contact accommodation part 63 is formed to penetrate the housing 30 in the vertical direction.

As shown in FIGS. 8 and 9, each contact accommodation part 63 includes a contact accommodation part main body 70 and a solder connection checking hole 71. The contact accommodation part main body 70 and the solder connection checking hole 71 are formed apart from each other in the width direction. Each of the contact accommodation part main body 70 and the solder connection checking hole 71 is a penetrating hole that penetrates the housing 30 in the vertical direction.

The housing 30 includes a width separating wall 72 that defines, in the width direction, the contact accommodation part main body 70 and the solder connection checking hole 71 of the contact accommodation part 63. A notch 73 is formed at the lower end of the width separating wall 72.

The housing 30 includes a pitch separating wall 74 that defines, in the pitch direction, the contact accommodation part main bodies 70 of the two contact accommodation parts 63 adjacent to each other in the pitch direction. A restriction wall 75 that projects in the pitch direction is formed at the upper end of the pitch separating wall 74.

Each contact 33 is described hereinafter in detail with reference to FIGS. 10 to 12. In this embodiment, all of the contacts 33 have the same shape. Alternatively, some of the contacts 33 may have different shapes.

Figure 10:
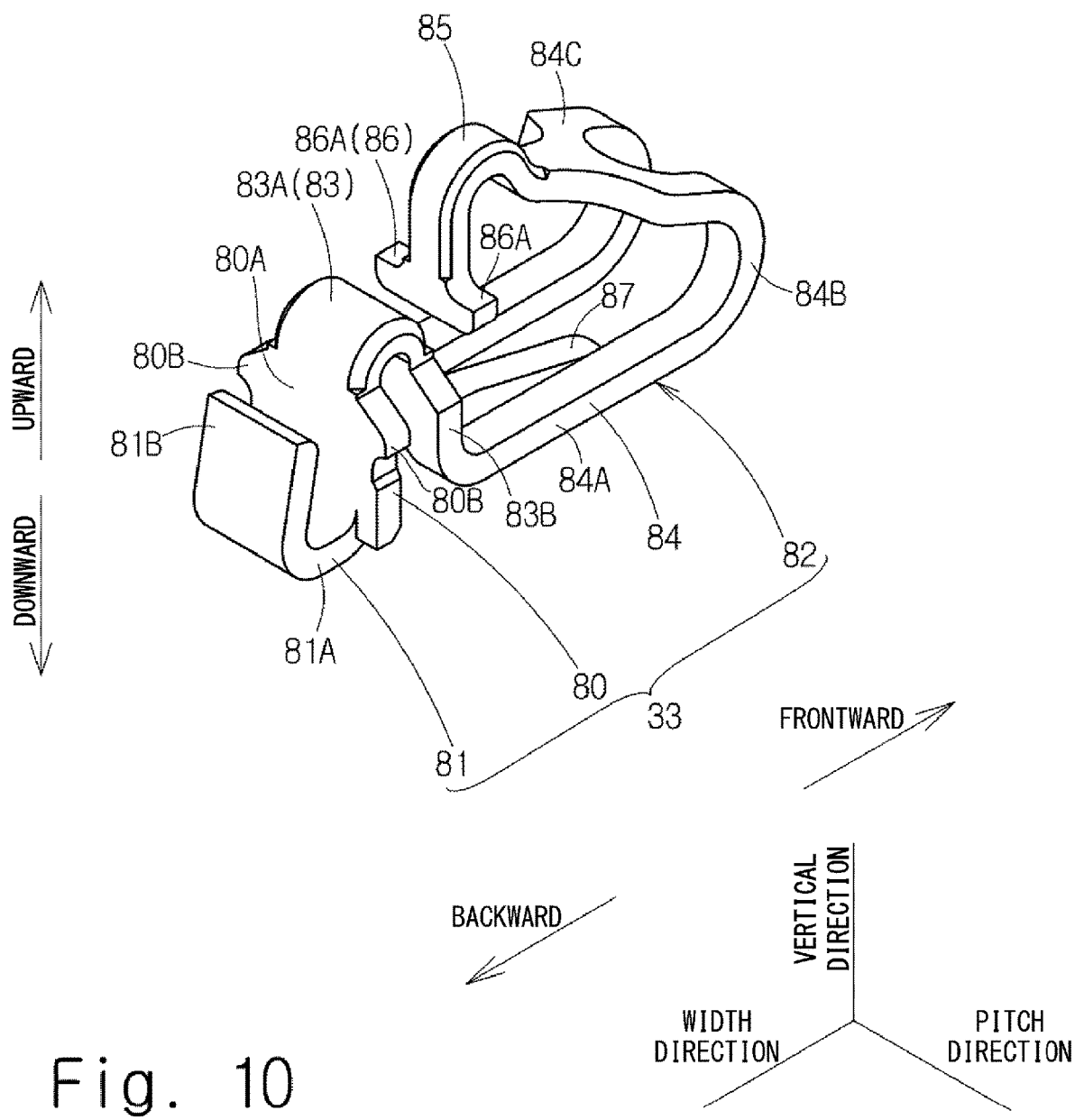
FIG. 10 is a perspective view of a contact (first embodiment)
Figure 11:
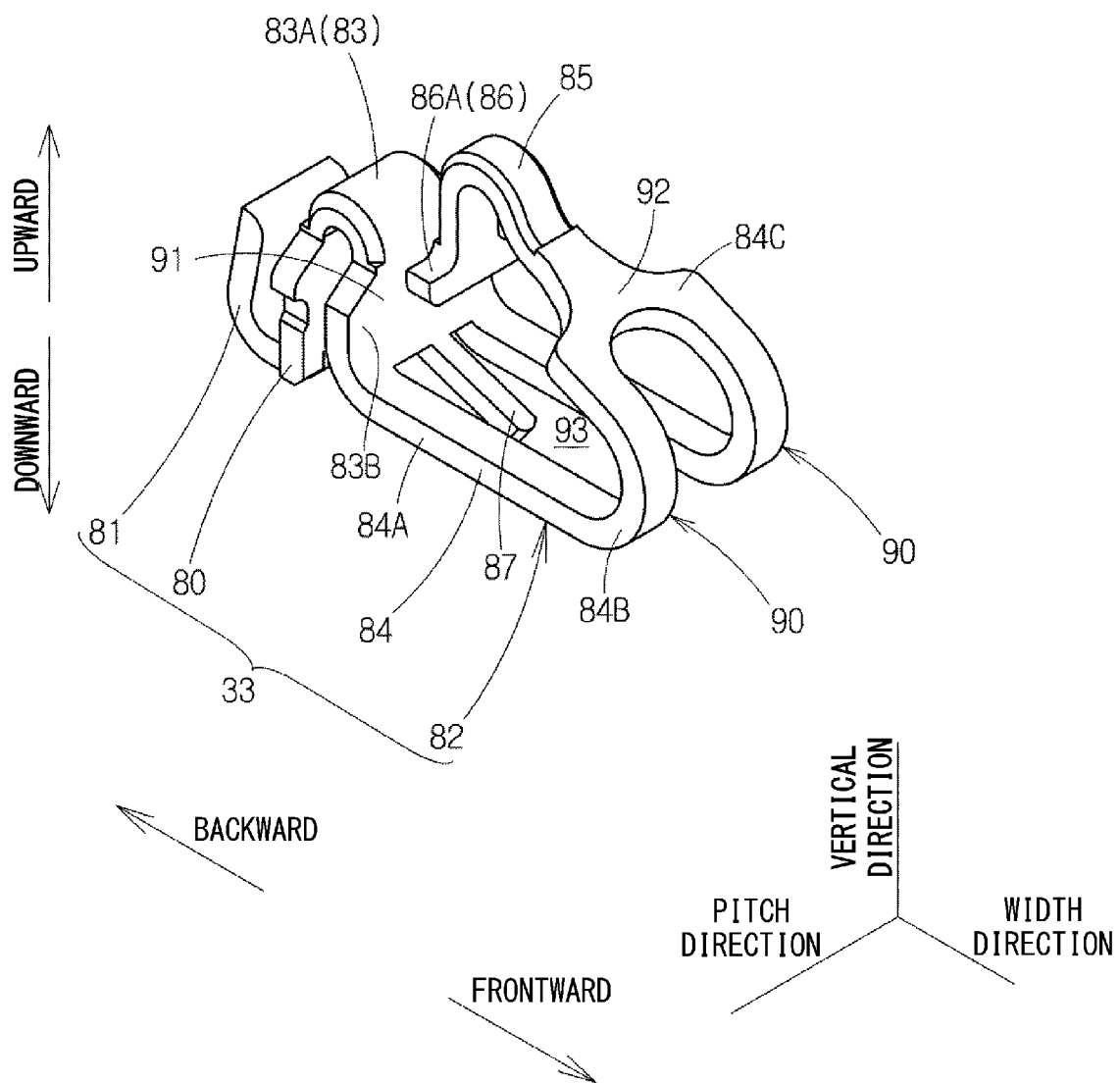
FIG. 11 is a perspective view of the contact when viewed from another angle (first embodiment)

FIGS. 10 and 11 are perspective views of each contact 33. FIG. 12 is a plan view of each contact 33.

Figure 12:
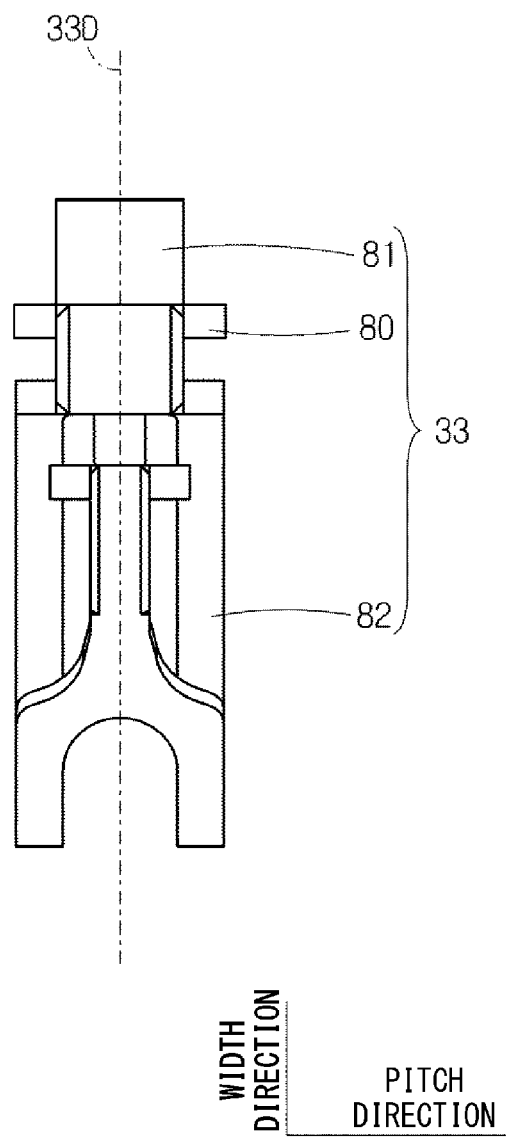
FIG. 12 is a plan view of the contact (first embodiment)

As shown in FIGS. 10 to 12, each contact 33 includes a fixed part 80, a soldering part 81, and an elastic deformation part 82.

The fixed part 80 is a part to be press-fit into the contact accommodation part main body 70 shown in FIG. 8. Specifically, the fixed part 80 is press-fit into the contact accommodation part main body 70, and thereby each contact 33 is held by the housing 30. The fixed part 80 is a plate body whose thickness direction is parallel to the width direction. The fixed part 80 includes a fixed part main body 80A and two press-fit lances 80B. The two press-fit lances 80B are formed to project in the pitch direction respectively from the both ends of the fixed part main body 80A in the pitch direction.

The soldering part 81 and the elastic deformation part 82 are disposed on the opposite sides to each other with the fixed part 80 interposed therebetween. The direction of viewing the elastic deformation part 82 from the soldering part 81 is referred to as frontward, and the direction of viewing the soldering part 81 from the elastic deformation part 82 is referred to as backward. Thus, the elastic deformation part 82 is disposed on the frontward side of the fixed part 80, and the soldering part 81 is disposed on the backward side of the fixed part 80.

The soldering part 81 includes a soldering part main body 81A and a position stabilization spring piece 81B. The soldering part main body 81A is a part to be soldered to the corresponding signal pad 15 of the input-output board 4 shown in FIG. 1. As shown in FIG. 10, the soldering part main body 81A extends backward from the lower end of the fixed part 80. The position stabilization spring piece 81B projects upward from the backward end of the soldering part main body 81A.

The elastic deformation part 82 is a part that functions as an electrical contact point with the corresponding signal pad 10 of the CPU board 2 shown in FIG. 2. As shown in FIG. 10, the elastic deformation part 82 includes a curve joining part 83, a U-shaped curve part 84, an upper contact part 85 (first contact part), a displacement restriction part 86, and a lower contact part 87 (second contact part). The curve joining part 83, the U-shaped curve part 84, the upper contact part 85, and the displacement restriction part 86 link together in this recited order.

The curve joining part 83 includes a joining part main body 83A and a vertical part 83B. The joining part main body 83A projects frontward from the upper end of the fixed part 80 and curves in a U-shape so as to be convex upward and open downward. The vertical part 83B projects downward from the distal end of the joining part main body 83A.

When the U-shaped curve part 84 is observed along the line of sight in the pitch direction, the U-shaped curve part 84 includes a lower straight part 84A, a curve part 84B, and an upper straight part 84C. The lower straight part 84A, the curve part 84B, and the upper straight part 84C link together in this recited order.

The lower straight part 84A extends frontward from the lower end of the vertical part 83B of the curve joining part 83 so as to be parallel to the width direction. The curve part 84B projects upward from the frontward end of the lower straight part 84A, and curves to be convex frontward and open backward. The upper straight part 84C projects backward from the upper end of the curve part 84B and is slightly inclined upward. Thus, when the U-shaped curve part 84 is observed along the line of sight in the pitch direction, the U-shaped curve part 84 is in a substantially U-shape that opens backward.

As shown in FIG. 11, the U-shaped curve part 84 has two spring pieces connected at both ends. Specifically, the U-shaped curve part 84 includes two spring pieces 90 that extend along the U-shaped curve part 84, a fixed part-side joining part 91 that join the two spring pieces 90 on the fixed part 80 side, and an upper contact part-side joining part 92 that join the two spring pieces 90 on the upper contact part 85 side. The two spring pieces 90 are opposed to each other in the pitch direction and separated from each other in the pitch direction. The two spring pieces 90 extend parallel to each other. The fixed part-side joining part 91 is located in the vertical part 83B of the curve joining part 83. The upper contact part-side joining part 92 is located in the upper straight part 84C. Thus, the two spring pieces 90 are formed along the lower straight part 84A and the upper straight part 84C. In other words, a slit 93 that is surrounded by the two spring pieces 90, the fixed part-side joining part 91, and the upper contact part-side joining part 92 extends along the lower straight part 84A and the upper straight part 84C.

The upper contact part 85 is a part that is configured to come into electrical contact with the corresponding signal pad 10 of the CPU board 2 shown in FIG. 2. As shown in FIG. 11, the upper contact part 85 is placed at the distal end of the upper straight part 84C of the U-shaped curve part 84, and it curves in a U-shape that is convex upward and opens downward.

As shown in FIG. 10, the displacement restriction part 86 includes two restriction pieces 86A that project oppositely from each other in the pitch direction from the distal end of the upper contact part 85.

Referring to FIGS. 10 and 11, the lower contact part 87 is disposed between the two spring pieces 90 in the pitch direction when viewed from above. As shown in FIG. 11, the lower contact part 87 is a cantilever that extends frontward from the vertical part 83B of the curve joining part 83, and it is inclined downward. Thus, the lower contact part 87 is a cantilever extending in a direction away from the fixed part 80.

As shown in FIG. 12, each contact 33 is formed symmetrically with respect to a bisecting line 33D that divides each contact 33 in half in the pitch direction.

FIG. 9 shows the state where each contact 33 is attached to each contact accommodation part 63. To attach each contact 33 to each contact accommodation part 63, each contact 33 is press-fit into the contact accommodation part main body 70 of each contact accommodation part 63 from below. Specifically, the two press-fit lances 80B of the fixed part 80 respectively bite into wall surfaces of the two pitch separating walls 74 that define the contact accommodation part main body 70 in the pitch direction. The elastic deformation part 82 is thereby accommodated into the contact accommodation part main body 70, the position stabilization spring piece 81B of the soldering part 81 is accommodated into the solder connection checking hole 71, and the soldering part main body 81A of the soldering part 81 is accommodated into the notch 73.

When press-fitting each contact 33, the two restriction pieces 86A of the displacement restriction part 86 come into contact with the lower surfaces of the corresponding restriction walls 75, and thereby the U-shaped curve part 84 is slightly elastically deformed in such a way that the U-shaped curve part 84 is compressed in the vertically direction. Thus, the elastic deformation part 82 is accommodated in the contact accommodation part main body 70 in the state where the U-shaped curve part 84 is slightly elastically deformed. This improves the coplanarity between the upper contact parts 85 of the plurality of contacts 33.

Further, when press-fitting each contact 33, since the width separating wall 72 is inserted between the fixed part 80 and the position stabilization spring piece 81B of the soldering part 81, the soldering part 81 is elastically deformed so that the position stabilization spring piece 81B moves away from the fixed part 80 in the width direction. Then, in the state where each contact 33 is press-fit, the position stabilization spring piece 81B is pressed against the width separating wall 72 by the elastic restoring force of the soldering part 81. In other words, the fixed part 80 and the soldering part 81 elastically sandwich the width separating wall 72 in the width direction. The position of each contact 33 after press-fitting is thereby stabilized.

Figure 13:
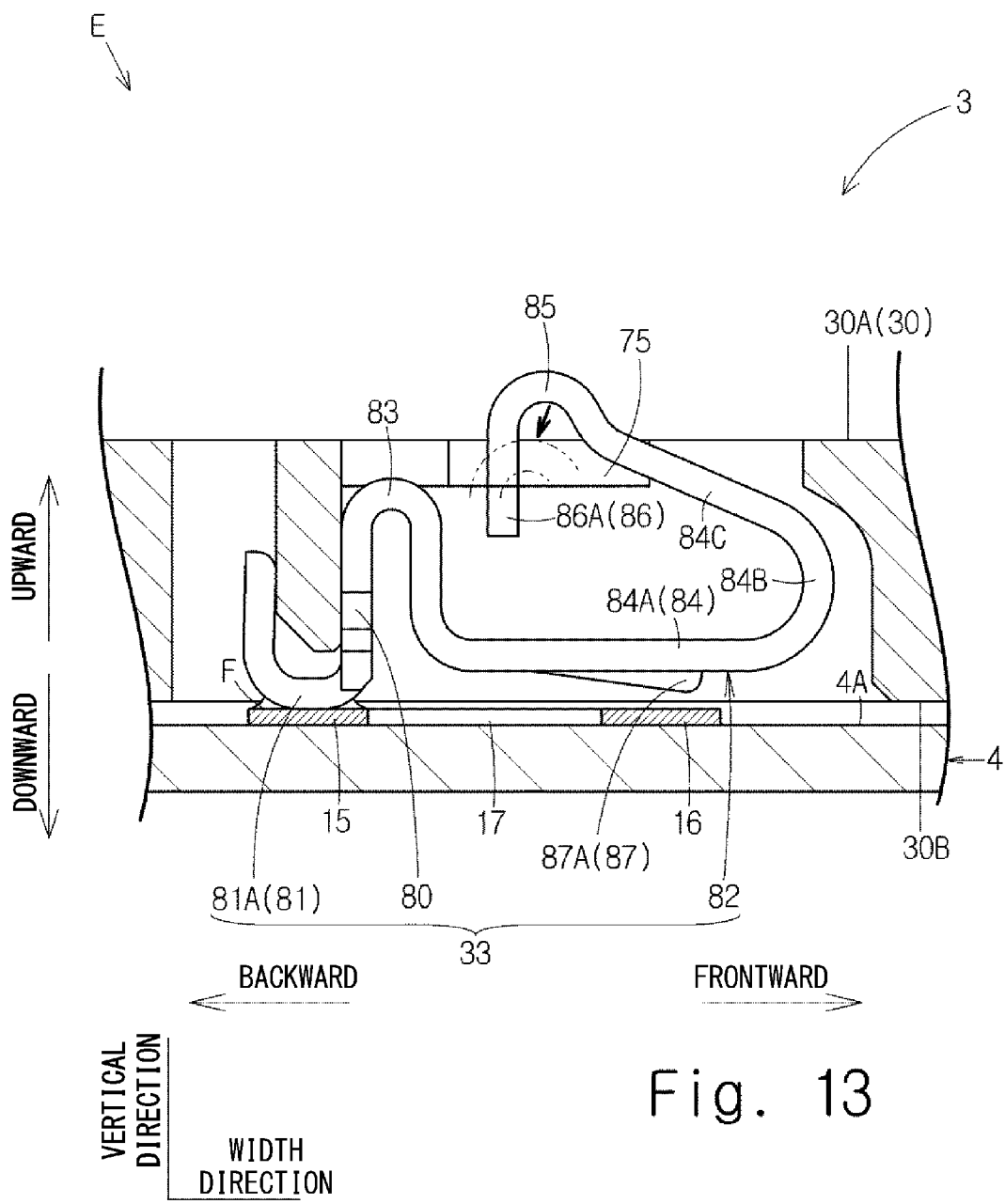
FIG. 13 is a view illustrating the movement of the contact (first embodiment)

FIG. 13 shows the state where the connector 3 is mounted on the connector opposed surface 4A of the input-output board 4. As shown in FIG. 13, on the connector opposed surface 4A of the input-output board 4, a short-circuiting pad 16 (third conductor) is formed in close proximity to the signal pad 15 (second conductor). The signal pad 15 and the short-circuiting pad 16 are coupled by a coupling pattern 17. The signal pad 15 and the short-circuiting pad 16 are thereby at the same potential. Alternatively, the signal pad 15 and the short-circuiting pad 16 may be coupled to each other to form a single pad without through the connection pattern 17.

The signal pad 15 and the short-circuiting pad 16 have the same thickness and are disposed on the connector opposed surface 4A of the input-output board 4. The signal pad 15 is disposed below the soldering part main body 81A of the soldering part 81, and the short-circuiting pad 16 is disposed below the lower contact part 87. As described above, in the state where the connector 3 is mounted on the connector opposed surface 4A of the input-output board 4, a distal end 87A of the lower contact part 87 is opposed to the short-circuiting pad 16 in the vertical direction without being in contact with the short-circuiting pad 16.

Referring further to FIG. 13, when the soldering part main body 81A of the soldering part 81 is soldered to the corresponding signal pad 15, a solder fillet F is formed between the soldering part main body 81A of the soldering part 81 and the signal pad 15. In this embodiment, the presence of the solder fillet F is checkable from above through the solder connection checking hole 71. This enables determining whether the soldering of each contact 33 is successfully made or not after mounting the connector 3 onto the input-output board 4.

Referring back to FIG. 1, when the CPU board 2 is fixed to the support board 5, the upper contact part 85 comes into contact with the corresponding signal pad 10 (refer also to FIG. 2) of the CPU board 2 and is also pressed downward as indicated by the chain double-dashed line in FIG. 13. When the upper contact part 85 is pressed downward, the uppermost part of the upper contact part 85 coincides with the CPU board opposed surface 30A of the housing 30 in the vertical direction. The amount of displacement of the upper contact part 85 in the vertical direction at this time is the same in all of the contacts 33.

As described above, when the upper contact part 85 is elastically displaced downward, in the early stage of displacement, the distal end 87A of the lower contact part 87 comes closer to the corresponding short-circuiting pad 16 but the distal end 87A of the lower contact part 87 does not come into contact with the short-circuiting pad 16. In the middle stage of displacement, the distal end 87A of the lower contact part 87 comes into contact with the short-circuiting pad 16. In the late stage of displacement, with the distal end 87A of the lower contact part 87 being in contact with the short-circuiting pad 16, the upper contact part 85 is further elastically displaced downward as the elastic deformation part 82 is elastically deformed. Then, when the upper contact part 85 is displaced to the position indicated by the chain double-dashed line, the upper contact part 85 comes to rest without being further displaced downward.

Thus, the current path from the upper contact part 85 to the signal pad 15 in the early stage of displacement is a path that runs through the upper contact part 85 of the elastic deformation part 82, the U-shaped curve part 84 of the elastic deformation part 82, the curve joining part 83 of the elastic deformation part 82, the fixed part 80, the soldering part main body 81A of the soldering part 81, and the signal pad 15 in sequence. Since the distal end 87A of the lower contact part 87 is not in contact with the short-circuiting pad 16 in the early stage of displacement, the elasticity of the elastic deformation part 82 does not harden. Therefore, the connection reliability between the contact 33 and the corresponding signal pad 10 (refer also to FIG. 2) is not degraded.

On the other hand, the current path from the upper contact part 85 to the signal pad 15 in the middle and late stages of displacement is a path that runs through the upper contact part 85 of the elastic deformation part 82, the U-shaped curve part 84 of the elastic deformation part 82, the lower contact part 87 of the elastic deformation part 82, the short-circuiting pad 16, and the signal pad 15 in sequence.

In this manner, since the current path length in the contact 33 is substantially reduced in the middle and late stages of displacement, the resistance value in the contact 33 in the middle and late stages of displacement is reduced.

When the CPU board 2 is detached from the support board 5, the upper contact part 85 is elastically displaced upward by the elastic restoring force of the elastic deformation part 82. Then, when the two restriction pieces 86A of the displacement restriction part 86 reach the lower surface of the restriction walls 75, further displacement is restricted, and it returns to the state indicated by the solid line in FIG. 13.

The first embodiment is described above. The above-described embodiment has the following features.

As shown in FIGS. 1, 2, 9 and 13, the connector 3 (electric connector) includes the housing 30 and the plurality of contacts 33 held by the housing 30. The plurality of contacts 33 electrically connect the plurality of signal pads 10 (first conductors) provided on the CPU board 2 (object) and the plurality of signal pads 15 (second conductors) provided on the input-output board 4 (board), respectively. At least one or several of the plurality of contacts 33 included in the connector 3 have the following feature.

Specifically, the contact 33 includes the fixed part 80 to be fixed to the housing 30, the soldering part 81 to be soldered to the corresponding signal pad 15, and the elastic deformation part 82 being a cantilever extending from the fixed part 80. The elastic deformation part 82 includes the upper contact part 85 (first contact part) configured to come into contact with a corresponding signal pad 10, and the lower contact part 87 (second contact part) configured to come into contact with the short-circuiting pad 16 (third conductor) provided on the input-output board 4 and at the same potential as the signal pad 15. When the upper contact part 85 is not in contact with the signal pad 10, the lower contact part 87 is not in contact with the short-circuiting pad 16, and when the upper contact part 85 comes into contact with the signal pad 10 and the elastic deformation part 82 is elastically deformed, the lower contact part 87 comes into contact with the short-circuiting pad 16. The current path length from the upper contact part 85 to the lower contact part 87 is shorter than the current path length from the upper contact part 85 to the soldering part 81. Thus, the current path from the upper contact part 85 to the signal pad 15 is reduced by running through the lower contact part 87. In this structure, the current path length is reduced without degrading the connection reliability of the contact 33.

Further, in this embodiment, when the upper contact part 85 is not in contact with the signal pad 10, the lower contact part 87 is not in contact with the short-circuiting pad 16. This achieves sufficient coplanarity of the soldering parts 81 of all of the contacts 33 and thereby allows the soldering parts 81 of all of the contacts 33 to come into contact with all of the signal pads 15, respectively, without any problem during reflow, and therefore the presence of the lower contact part 87 does not affect the success or failure of reflow.

Further, as shown in FIGS. 10 and 11, the elastic deformation part 82 has the two spring pieces 90 interposed between the upper contact part 85 and the fixed part 80. The two spring pieces 90 extend separately from each other in the pitch direction and parallel to each other. The two spring pieces 90 are connected at both ends. The lower contact part 87 is disposed between the two spring pieces 90 in the pitch direction. In this structure, the lower contact part 87 is not easily touchable, which avoids damaging the lower contact part 87 when handling the contact 33.

The lower contact part 87 is a cantilever extending in a direction away from the fixed part 80. In this structure, the beam length of the lower contact part 87 increases, which allows the lower contact part 87 to have sufficient elasticity. This contributes to high connection reliability between the lower contact part 87 and the short-circuiting pad 16.

The insertion loss of transmission signals in a connector for differential transmission generally has frequency characteristics that increase as the frequency of transmission signals increases. A local increase in insertion loss, which is called spiking phenomenon, can occur in the waveform representing such frequency characteristics. When the spike occurs at a relatively low frequency, product requirements related to the frequency characteristics of the insertion loss are not met. Note that product requirements related to the frequency characteristics of the insertion loss are specified in a predetermined frequency range, and no problem arises as long as the spiking phenomenon occurs at higher frequencies than this frequency range. One known way to shift the spiking phenomenon to the high frequency side is to reduce the current path length in ground contacts. However, reducing the current path lengths of a contact causes the elasticity of the contact to harden, which degrades the connection reliability. Thus, there is a problem that compatibility between the high-frequency transmission characteristics and the connection reliability is not achievable in a connector for differential transmission.

On the other hand, as described above, the contact 33 according to this embodiment has a feature that enables reducing the current path length while retaining a certain degree of elasticity. Thus, by using this contact 33 as a ground contact, the high-frequency transmission characteristics and the connection reliability are both achievable in a connector for differential transmission.

The plurality of contacts 33 include signal contacts for differential transmission and ground contacts. The contact 33 having the lower contact part 87 is applied at least to the ground contacts.

Note that, only ground contacts among the plurality of contacts 33 of the connector 3 may be the contacts 33 having the lower contact part 87 as shown in FIG. 10, or all of the contacts 33 of the connector 3 may be the contacts 33 having the lower contact part 87 as shown in FIG. 10.

Further, a board assembly E shown in FIG. 13 includes the input-output board 4 and the connector 3 mounted on the input-output board 4. In the board assembly E, the connector 3 is mounted on the input-output board 4. In this structure, the board assembly E in which the current path length is reduced without degrading the connection reliability of the contact 33 is achieved.

Second Embodiment

Figure 14:
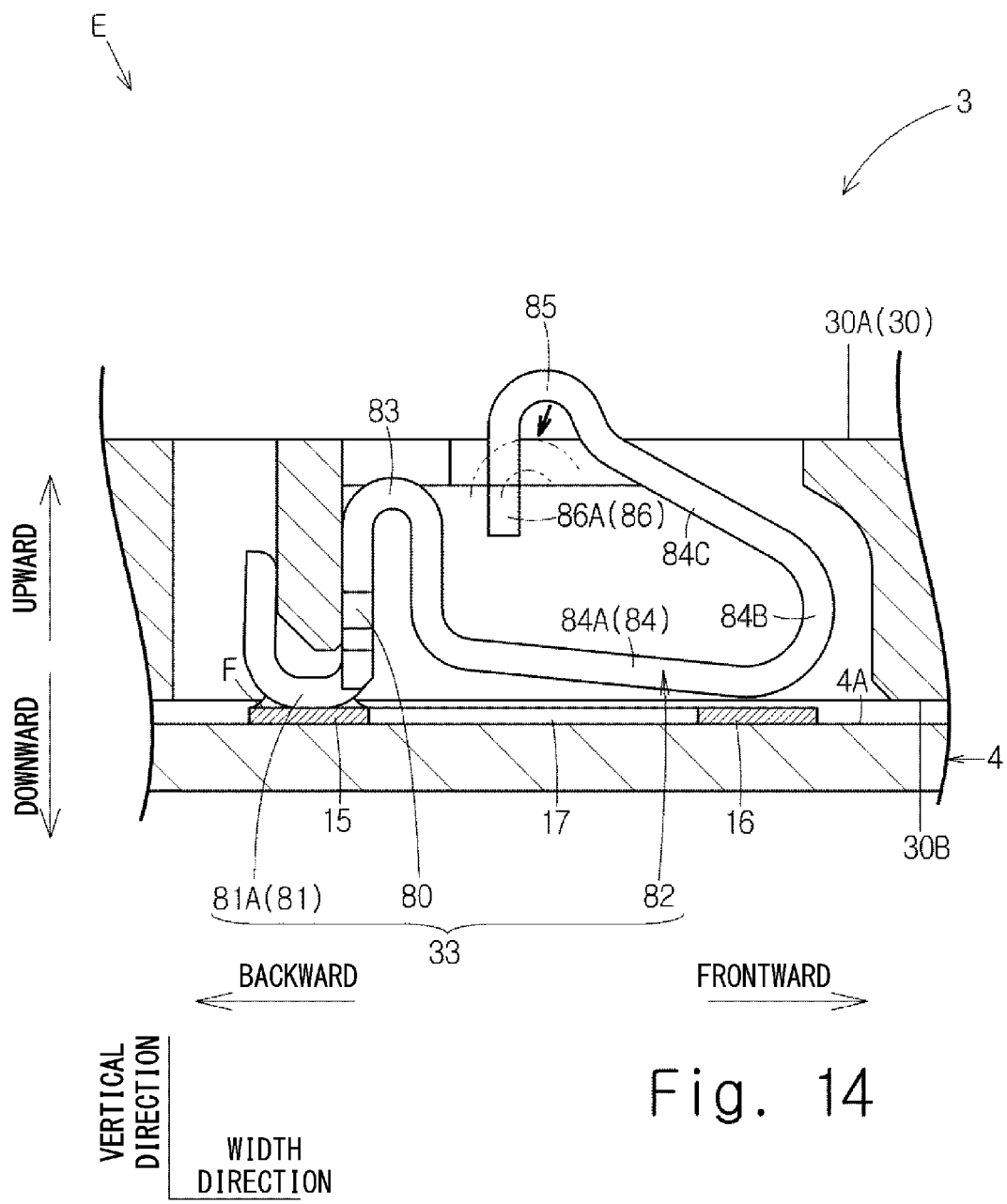
FIG. 14 is a view illustrating the movement of the contact (second embodiment)

A second embodiment will be described hereinafter with reference to FIG. 14. Differences of this embodiment from the above-described first embodiment will be mainly described below, and redundant description thereof is omitted. FIG. 14 shows the state where the connector 3 is mounted on the connector opposed surface 4A of the input-output board 4.

Referring back to FIG. 13, in the above-described first embodiment, the contact 33 includes the lower contact part 87 that is configured to come into contact with the short-circuiting pad 16.

On the other hand, as shown in FIG. 14, the contact 33 in this embodiment has a structure in which the lower straight part 84A of the U-shaped curve part 84 of the elastic deformation part 82 of the contact 33 is inclined downward as it goes frontward, rather than including the lower contact part 87.

As shown in FIG. 14, the short-circuiting pad 16 is disposed below the curve part 84B. As described above, in the state where the connector 3 is mounted on the connector opposed surface 4A of the input-output board 4, the curve part 84B is opposed to the short-circuiting pad 16 in the vertical direction without being in contact with the short-circuiting pad 16.

Referring back to FIG. 1, when the CPU board 2 is fixed to the support board 5, the upper contact part 85 comes into contact with the corresponding signal pad 10 (refer also to FIG. 2) of the CPU board 2 and is also pressed downward as indicated by the chain double-dashed line in FIG. 14. When the upper contact part 85 is pressed downward, the uppermost part of the upper contact part 85 coincides with the CPU board opposed surface 30A of the housing 30 in the vertical direction. The amount of displacement of the upper contact part 85 in the vertical direction at this time is the same in all of the contacts 33.

As described above, when the upper contact part 85 is elastically displaced downward, in the early stage of displacement, the curve part 84B of the U-shaped curve part 84 comes closer to the corresponding short-circuiting pad 16 but does not come into contact with the short-circuiting pad 16. In the middle stage of displacement, the curve part 84B of the U-shaped curve part 84 comes into contact with the short-circuiting pad 16. In the late stage of displacement, with the curve part 84B of the U-shaped curve part 84 being in contact with the short-circuiting pad 16, the upper contact part 85 is further elastically displaced downward as the elastic deformation part 82 is elastically deformed. Then, when the upper contact part 85 is displaced to the position indicated by the chain double-dashed line, the upper contact part 85 comes to rest without being further displaced downward.

Thus, the current path from the upper contact part 85 to the signal pad 15 in the early stage of displacement is a path that runs through the upper contact part 85 of the elastic deformation part 82, the U-shaped curve part 84 of the elastic deformation part 82, the curve joining part 83 of the elastic deformation part 82, the fixed part 80, the soldering part main body 81A of the soldering part 81, and the signal pad 15 in sequence. Since the curve part 84B of the U-shaped curve part 84 is not in contact with the short-circuiting pad 16 in the early stage of displacement, the elasticity of the elastic deformation part 82 does not harden. Therefore, the connection reliability between the contact 33 and the corresponding signal pad 10 (refer also to FIG. 2) is not degraded.

On the other hand, the current path from the upper contact part 85 to the signal pad 15 in the middle and late stages of displacement is a path that runs through the upper contact part 85 of the elastic deformation part 82, the curve part 84B of the U-shaped curve part 84 of the elastic deformation part 82, the short-circuiting pad 16, and the signal pad 15 in sequence. In this manner, since the current path length in the contact 33 is substantially reduced in the middle and late stages of displacement, the resistance value in the contact 33 in the middle and late stages of displacement is reduced.

The second embodiment is described above, and the above-described embodiment has the following features.

As shown in FIG. 14, the elastic deformation part 82 has the U-shaped curve part 84 interposed between the upper contact part 85 (first contact part) and the fixed part 80. The curve part 84B serving as a second contact part is a part of the U-shaped curve part 84. In this structure, the current path length is reduced in a simple structure without degrading the connection reliability of the contact 33.

Further, the U-shaped curve part 84 includes the lower straight part 84A (first straight part), the curve part 84B, and the upper straight part 84C (second straight part) in this recited order from the fixed part 80 toward the upper contact part 85. The curve part 84B functions as the second contact part. In this structure, the curve part 84B serves as a contact point with the short-circuiting pad 16.

Third Embodiment

Figure 15:
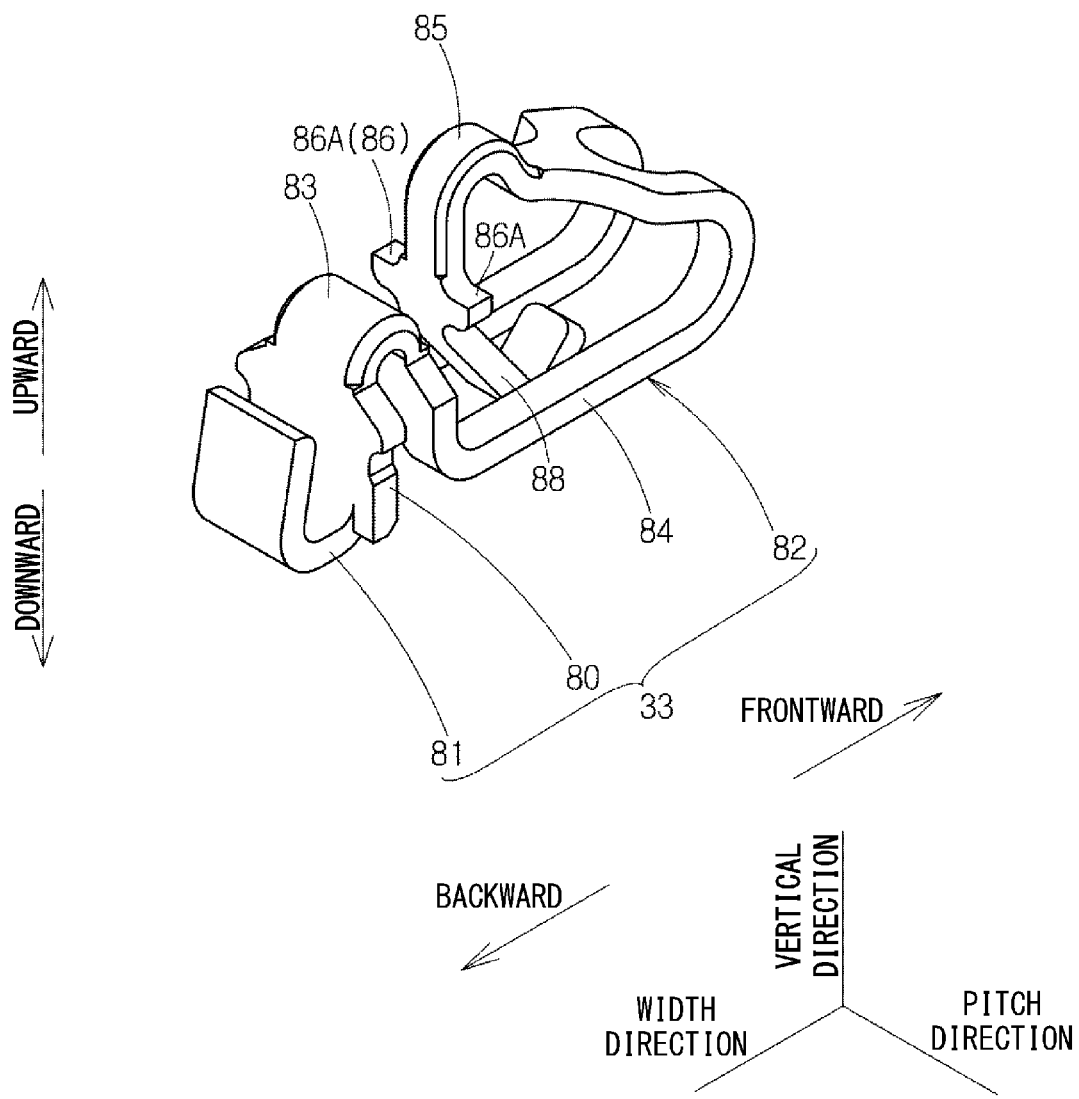
FIG. 15 is a perspective view of the contact (third embodiment)
Figure 16:
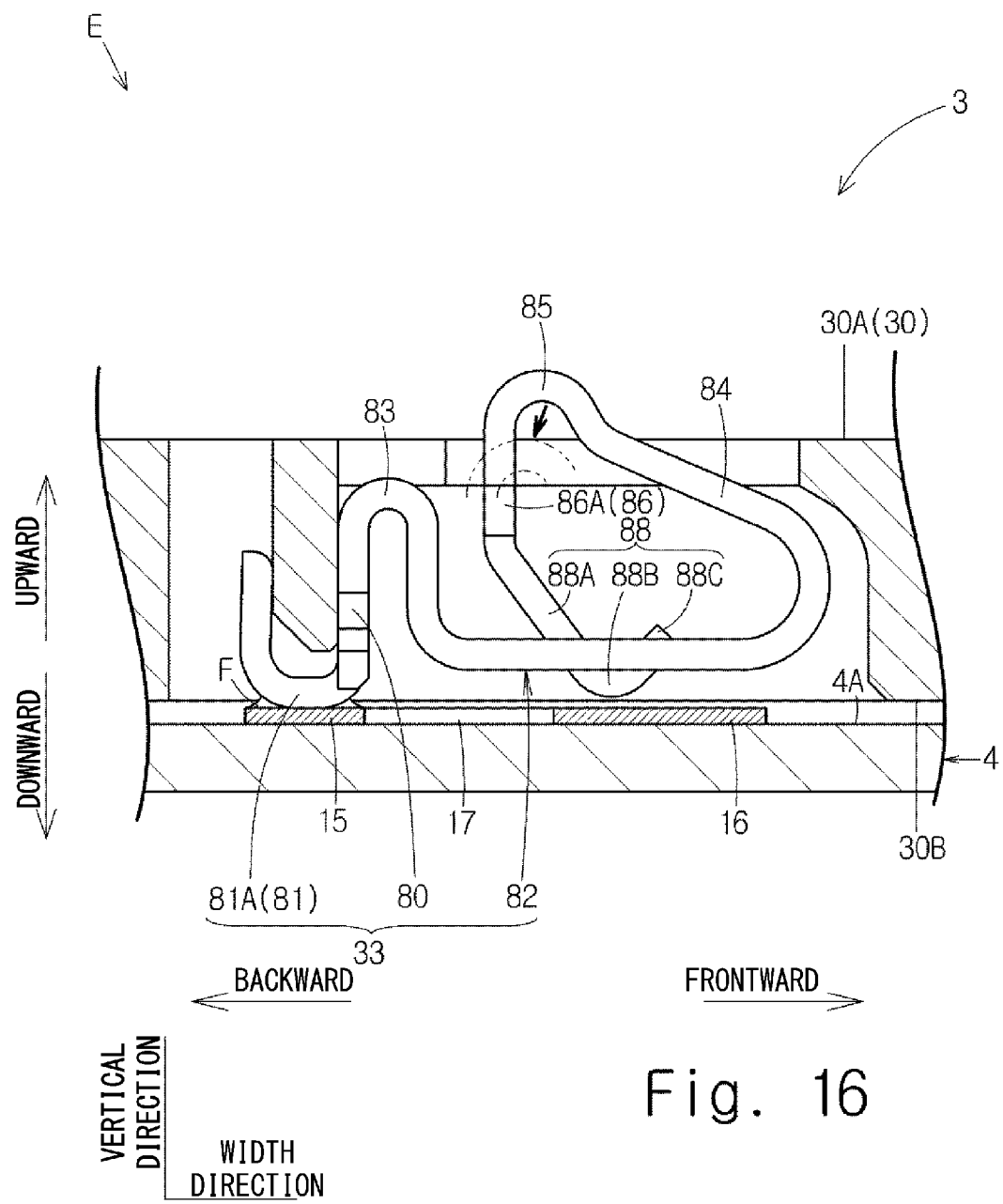
FIG. 16 is a view illustrating the movement of the contact (third embodiment)

A third embodiment will be described hereinafter with reference to FIGS. 15 and 16. Differences of this embodiment from the above-described first embodiment will be mainly described below, and redundant description thereof is omitted. FIG. 15 is a perspective view of the contact 33. FIG. 16 shows the state where the connector 3 is mounted on the connector opposed surface 4A of the input-output board 4.

Referring back to FIG. 13, in the above-described first embodiment, the contact 33 includes the lower contact part 87 that is configured to come into contact with the short-circuiting pad 16.

On the other hand, as shown in FIGS. 15 and 16, the contact 33 in this embodiment includes a downward extending spring piece 88 (second contact part), rather than including the lower contact part 87. The downward extending part spring piece 88 is a part of the elastic deformation part 82.

The downward extending spring piece 88 is a cantilever extending downward from the distal end of the upper contact part 85. Specifically, the downward extending spring piece 88 is a cantilever extending from the distal end of the upper contact part 85 toward the input-output board 4. As shown in FIG. 16, the downward extending spring piece 88 includes a first extending part 88A, a bent part 88B, and a second extending part 88C. The first extending part 88A, the bent part 88B, and the second extending part 88C link together in this recited order.

The first extending part 88A extends downward in a straight manner from the distal end of the upper contact part 85. To be specific, the first extending part 88A extends downward from the distal end of the upper contact part 85 and is inclined frontward.

The bent part 88B is provided at the lower end of the distal end of the upper contact part 85 and is bent in a V-shape to be convex downward.

The second extending part 88C extends upward in a straight manner from the distal end of the bent part 88B. To be specific, the second extending part 88C extends upward from the distal end of the bent part 88B and is inclined frontward.

Thus, the downward extending spring piece 88 is formed in a substantially V-shape when viewed in the pitch direction.

As shown in FIG. 16, the short-circuiting pad 16 is disposed below the bent part 88B. As described above, in the state where the connector 3 is mounted on the connector opposed surface 4A of the input-output board 4, the bent part 88B of the downward extending spring piece 88 is opposed to the short-circuiting pad 16 in the vertical direction without being in contact with the short-circuiting pad 16.

Referring back to FIG. 1, when the CPU board 2 is fixed to the support board 5, the upper contact part 85 comes into contact with the corresponding signal pad 10 (refer also to FIG. 2) of the CPU board 2 and is also pressed downward as indicated by the chain double-dashed line in FIG. 16. When the upper contact part 85 is pressed downward, the uppermost part of the upper contact part 85 coincides with the CPU board opposed surface 30A of the housing 30 in the vertical direction. The amount of displacement of the upper contact part 85 in the vertical direction at this time is the same in all of the contacts 33.

As described above, when the upper contact part 85 is elastically displaced downward, in the early stage of displacement, the bent part 88B of the downward extending spring piece 88 comes closer to the corresponding short-circuiting pad 16 but does not come into contact with the short-circuiting pad 16. In the middle stage of displacement, the bent part 88B of the downward extending spring piece 88 comes into contact with the short-circuiting pad 16. In the late stage of displacement, with the bent part 88B of the downward extending spring piece 88 being in contact with the short-circuiting pad 16, the upper contact part 85 is further elastically displaced downward as the elastic deformation part 82 is elastically deformed. Then, when the upper contact part 85 is displaced to the position indicated by the chain double-dashed line, the upper contact part 85 comes to rest without being further displaced downward.

Thus, the current path from the upper contact part 85 to the signal pad 15 in the early stage of displacement is a path that runs through the upper contact part 85 of the elastic deformation part 82, the U-shaped curve part 84 of the elastic deformation part 82, the curve joining part 83 of the elastic deformation part 82, the fixed part 80, the soldering part main body 81A of the soldering part 81, and the signal pad 15 in sequence. Since the bent part 88B of the downward extending spring piece 88 is not in contact with the short-circuiting pad 16 in the early stage of displacement, the elasticity of the elastic deformation part 82 does not harden. Therefore, the connection reliability between the contact 33 and the corresponding signal pad 10 (refer also to FIG. 2) is not degraded.

On the other hand, the current path from the upper contact part 85 to the signal pad 15 in the middle and late stages of displacement is a path that runs through the upper contact part 85 of the elastic deformation part 82, the first extending part 88A of the downward extending spring piece 88, the bent part 88B of the downward extending spring piece 88, the short-circuiting pad 16, and the signal pad 15 in sequence. In this manner, since the current path length in the contact 33 is substantially reduced in the middle and late stages of displacement, the resistance value in the contact 33 in the middle and late stages of displacement is reduced.

Note that, in the late stage of displacement, the bent part 88B of the downward extending spring piece 88 slides frontward on the short-circuiting pad 16. Therefore, contact resistance between the bent part 88B of the downward extending spring piece 88 and the short-circuiting pad 16 is improved by wiping.

The third embodiment is described above, and the above-described embodiment has the following features.

As shown in FIG. 16, the elastic deformation part 82 has the U-shaped curve part 84 interposed between the upper contact part 85 (first contact part) and the fixed part 80. The downward extending spring piece 88 (second contact part) is a cantilever extending from the upper contact part 85 toward the input-output board 4 (board). In this structure, since the U-shaped curve part 84 is not included in the current path from the upper contact part 85 to the signal pad 15 in the state where the bent part 88B of the downward extending spring piece 88 is in contact with the short-circuiting pad 16, the length of this current path is significantly reduced.

Note that, as shown in FIG. 16, the U-shaped curve part 84, the upper contact part 85, and the downward extended spring piece 88 link together in this recited order.

Fourth Embodiment

Figure 17:
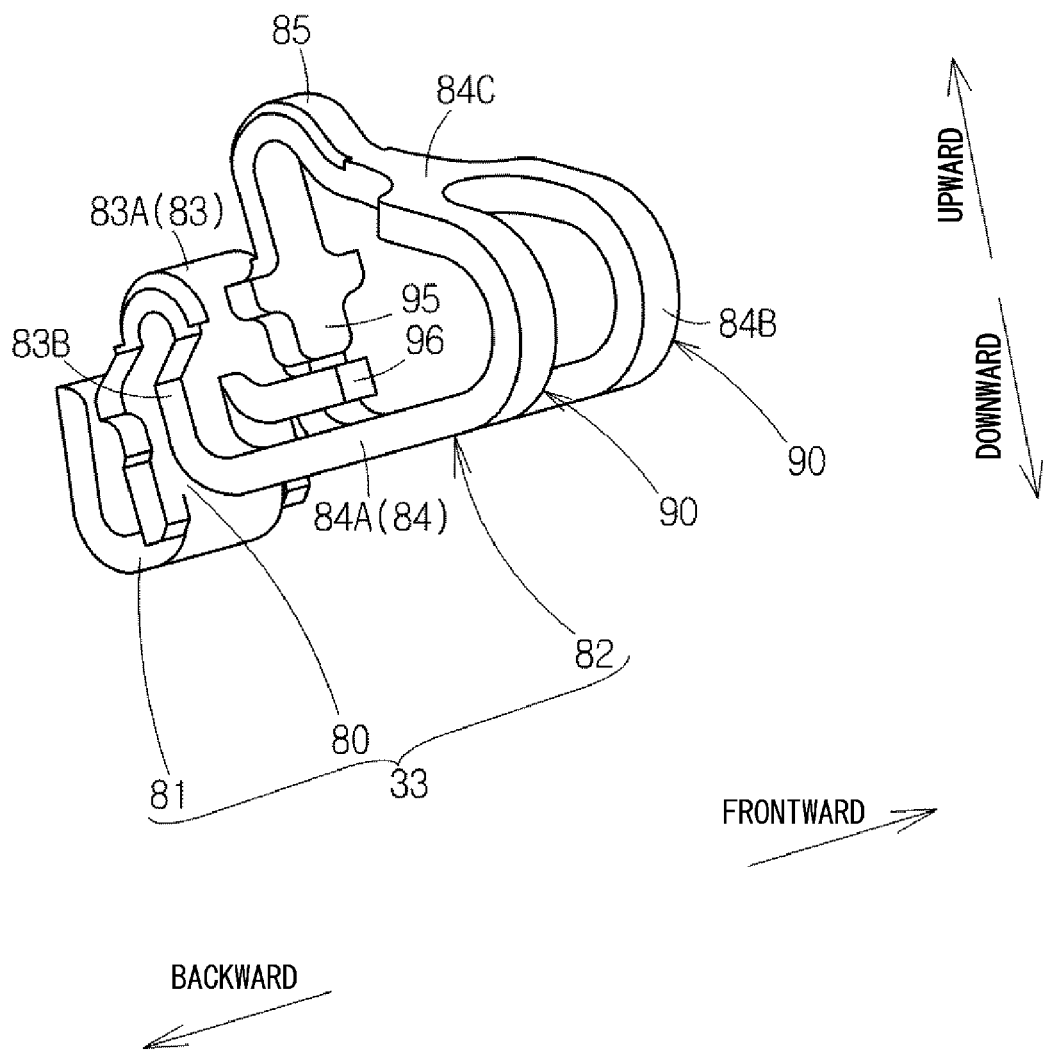
FIG. 17 is a perspective view of the contact (fourth embodiment)
Figure 18:
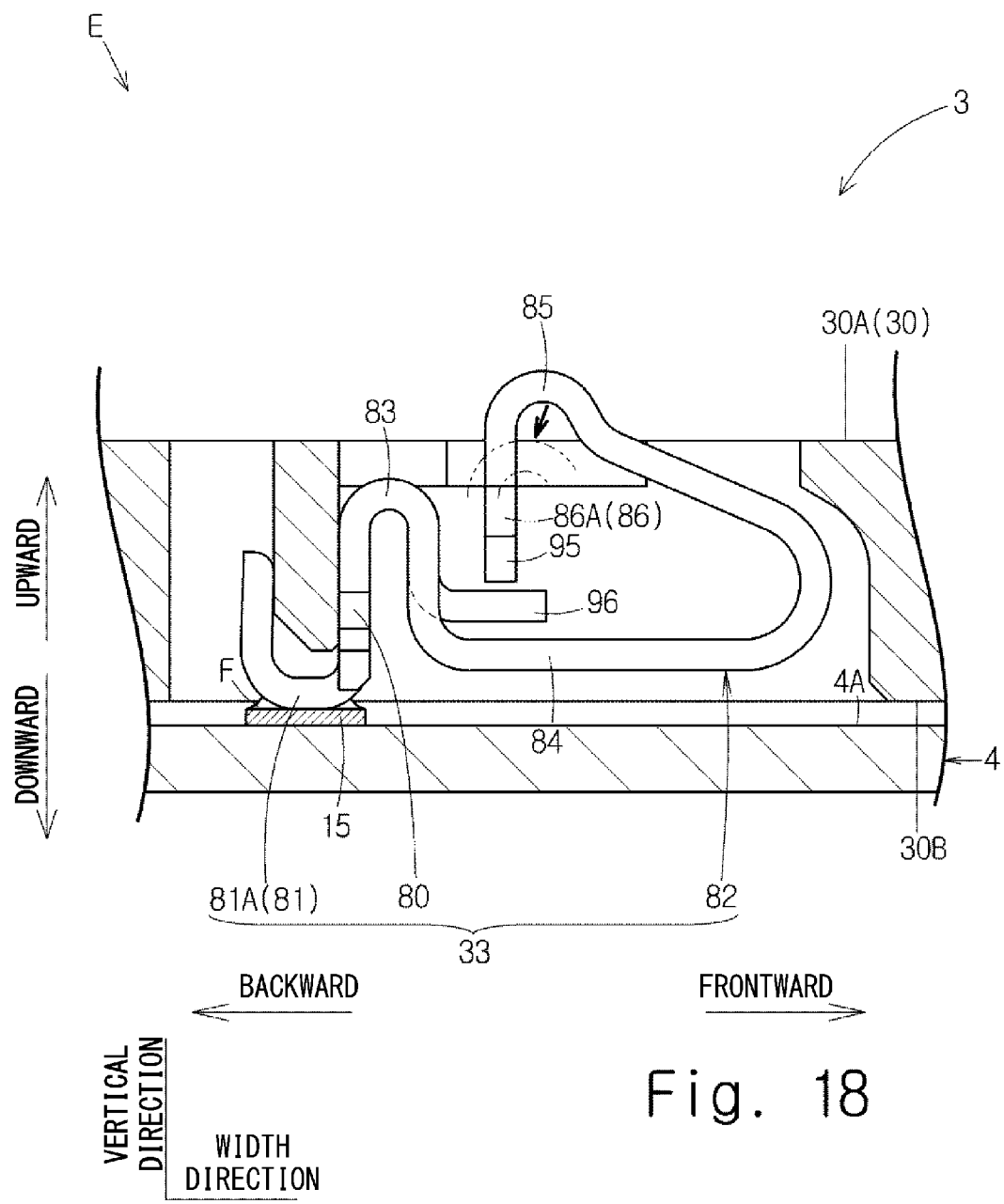
FIG. 18 is a view illustrating the movement of the contact (fourth embodiment)
Figure 19:
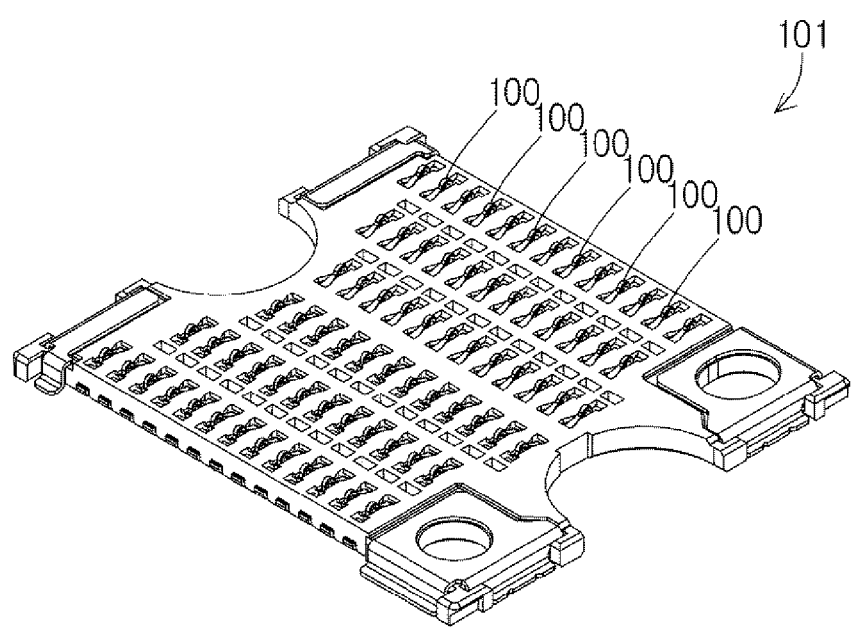
FIG. 19 is a simplified drawing of FIG. 3 of Patent Literature 1.

A fourth embodiment will be described hereinafter with reference to FIGS. 17 and 18. Differences of this embodiment from the above-described first embodiment will be mainly described below, and redundant description thereof is omitted. FIG. 17 is a perspective view of the contact 33. FIG. 18 shows the state where the connector 3 is mounted on the connector opposed surface 4A of the input-output board 4.

Referring back to FIG. 13, in the above-described first embodiment, the contact 33 includes the lower contact part 87 that is configured to come into contact with the short-circuiting pad 16.

On the other hand, as shown in FIGS. 17 and 18, the contact 33 in this embodiment includes a downward projecting part 95 (second contact part) and a horizontal projecting part 96 (third contact part), rather than including the lower contact part 87. Each of the downward projecting part 95 and the horizontal projecting part 96 is a part of the elastic deformation part 82.

The downward projecting part 95 is a cantilever extending downward in a straight manner from the distal end of the upper contact part 85. Specifically, the downward projecting part 95 is a cantilever extending from the distal end of the upper contact part 85 toward the input-output board 4. In other words, the downward projecting part 95 projects downward from the distal end of the upper contact part 85.

The horizontal projecting part 96 is a cantilever projecting in the width direction from the vertical part 83B of the curve joining part 83. Specifically, the horizontal projecting part 96 projects frontward from the vertical part 83B of the curve joining part 83. The horizontal projecting part 96 is disposed between the two spring pieces 90 in the pitch direction when viewed from above. The horizontal projecting part 96 is disposed above the lower straight part 84A of the U-shaped curve part 84 in lateral view. As shown in FIG. 18, the downward projecting part 95 and the horizontal projecting part 96 are opposed to each other in the vertical direction. Specifically, the horizontal projecting part 96 is disposed below the downward projecting part 95. As described above, in the state where the connector 3 is mounted on the connector opposed surface 4A of the input-output board 4, the downward projecting part 95 is opposed to the horizontal projecting part 96 in the vertical direction without being in contact with the horizontal projecting part 96.

Referring back to FIG. 1, when the CPU board 2 is fixed to the support board 5, the upper contact part 85 comes into contact with the corresponding signal pad 10 (refer also to FIG. 2) of the CPU board 2 and is also pressed downward as indicated by the chain double-dashed line in FIG. 18. When the upper contact part 85 is pressed downward, the uppermost part of the upper contact part 85 coincides with the CPU board opposed surface 30A of the housing 30 in the vertical direction. The amount of displacement of the upper contact part 85 in the vertical direction at this time is the same in all of the contacts 33.

As described above, when the upper contact part 85 is elastically displaced downward, in the early stage of displacement, the downward projecting part 95 comes closer to the horizontal projecting part 96 but does not come into contact with the horizontal projecting part 96. In the middle stage of displacement, the downward projecting part 95 comes into contact with the horizontal projecting part 96. In the late stage of displacement, with the downward projecting part 95 being in contact with the horizontal projecting part 96, the upper contact part 85 is further elastically displaced downward as the curve joining part 83 and the horizontal projecting part 96 are elastically deformed. Then, when the upper contact part 85 is displaced to the position indicated by the chain double-dashed line, the upper contact part 85 comes to rest without being further displaced downward.

Thus, the current path from the upper contact part 85 to the signal pad 15 in the early stage of displacement is a path that runs through the upper contact part 85 of the elastic deformation part 82, the U-shaped curve part 84 of the elastic deformation part 82, the curve joining part 83 of the elastic deformation part 82, the fixed part 80, the soldering part main body 81A of the soldering part 81, and the signal pad 15 in sequence. Since the downward projecting part 95 is not in contact with the horizontal projecting part 96 in the early stage of displacement, the elasticity of the elastic deformation part 82 does not harden. Therefore, the connection reliability between the contact 33 and the corresponding signal pad 10 (refer also to FIG. 2) is not degraded.

On the other hand, the current path from the upper contact part 85 to the signal pad 15 in the middle and late stages of displacement is a path that runs through the upper contact part 85 of the elastic deformation part 82, the downward projecting part 95, the horizontal projecting part 96, the curve joining part 83, the fixed part 80, the soldering part 81, and the signal pad 15 in sequence. In this manner, since the current path length in the contact 33 is substantially reduced in the middle and late stages of displacement, the resistance value in the contact 33 in the middle and late stages of displacement is reduced.

The fourth embodiment is described above, and the above-described embodiment has the following features.

The elastic deformation part 82 has the U-shaped curve part 84 interposed between the upper contact part 85 (first contact part) and the fixed part 80. The downward projecting part 95 (second contact part) is a cantilever extending from the upper contact part 85 toward the input-output board 4 (board). The elastic deformation part 82 further includes the horizontal projecting part 96 (third contact part). The downward projecting part 95 is configured to come into contact with the horizontal projecting part 96 instead of coming into contact with the short-circuiting pad 16 as shown in FIG. 16. When the upper contact part 85 is not in contact with the signal pad 10 (first conductor), the downward projecting part 95 is not in contact with the horizontal projecting part 96, and when the upper contact part 85 comes into contact with the signal pad 10 and the elastic deformation part 82 is elastically deformed, the downward projecting part 95 comes into contact with the horizontal projecting part 96. The current path length from the upper contact part 85 to the soldering part 81 through the downward projecting part 95 and the horizontal projecting part 96 is shorter than the current path length from the upper contact part 85 to the soldering part 81 through the U-shaped curve part 84. In this structure, the current path length is reduced without degrading the connection reliability of the contact 33.

Further, as shown in FIG. 17, the U-shaped curve part 84 includes the two spring pieces 90 that extend separately from each other in the pitch direction and parallel to each other. The two spring pieces 90 are connected at both ends. The horizontal projecting part 96 is a cantilever disposed between the two spring pieces 90 in the pitch direction when viewed from above. In this structure, the horizontal projecting part 96 is not easily touchable, which avoids damaging the horizontal projecting part 96 when handling the contact 33.

The first to fourth embodiments of the present disclosure are described above. Each of the embodiments may be varied as follows, for example.

Although, as shown in FIG. 1, the connector 3 is a board-to-board connector that connects the CPU board 2 and the input-output board 4 in the above-described embodiments, the present disclosure is not limited thereto. The connector 3 may be a cable-to-board connector or a cable-to-cable connector.

The first and forth embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. An electric connector comprising:
   a housing; and
   a plurality of contacts held by the housing, wherein
   the plurality of contacts electrically connect a plurality of first conductors provided on an object and a plurality of second conductors provided on a board, respectively,
   at least one contact of the plurality of contacts includes:
      a fixed part to be fixed to the housing;
      a soldering part to be soldered to a corresponding second conductor; and
      an elastic deformation part being a cantilever extending from the fixed part,
   the elastic deformation part includes:
      a first contact part configured to come into contact with a corresponding first conductor;
      a second contact part configured to come into contact with a third conductor provided on the board, the third conductor being at the same potential as the second conductor; and
      two spring pieces interposed between the first contact part and the fixed part, the two spring pieces extending separately from each other in a pitch direction and parallel to each other and being connected at both ends,
   wherein the first contact part and the second contact part are configured such that, when the first contact part is not in contact with the first conductor, the second contact part is not in contact with the third conductor, and such that when the first contact part comes into contact with the first conductor and the elastic deformation part is elastically deformed, the second contact part comes into contact with the third conductor, and
   a current path length from the first contact part to the second contact part is shorter than a current path length from the first contact part to the soldering part.

2. The electric connector according to claim 1, wherein the second contact part is disposed between the two spring pieces in the pitch direction.

3. The electric connector according to claim 2, wherein the second contact part is a cantilever extending in a direction away from the fixed part.

4. The electric connector according to claim 1, wherein the elastic deformation part has a U-shaped curve part interposed between the first contact part and the fixed part, and the second contact part is a part of the U-shaped curve part.

5. The electric connector according to claim 4, wherein the U-shaped curve part includes a first straight part, a curve part, and a second straight part in this recited order from the fixed part toward the first contact part, and
the curve part functions as the second contact part.

6. A board assembly comprising:
a board including a plurality of second conductors and a third conductor, and
the electric connector according to claim 1 mounted on the board.

7. An electric connector comprising:
a housing; and
  a plurality of contacts held by the housing, wherein
  the plurality of contacts electrically connect a plurality of first conductors provided on an object and a plurality of second conductors provided on a board, respectively,
  at least one contact of the plurality of contacts includes:
    a fixed part to be fixed to the housing;
    a soldering part to be soldered to a corresponding second conductor; and
    an elastic deformation part being a cantilever extending from the fixed part,
  the elastic deformation part includes:
    a first contact part configured to come into contact with a corresponding first conductor; and
    a second contact part configured to come into contact with a third conductor provided on the board, the third conductor being at the same potential as the second conductor,
  wherein the first contact part and the second contact part are configured such that, when the first contact part is not in contact with the first conductor, the second contact part is not in contact with the third conductor, and such that when the first contact part comes into contact with the first conductor and the elastic deformation part is elastically deformed, the second contact part comes into contact with the third conductor, and
  a current path length from the first contact part to the second contact part is shorter than a current path length from the first contact part to the soldering part,
  the elastic deformation part has a U-shaped curve part interposed between the first contact part and the fixed part, and
  the second contact part is a cantilever extending from the first contact part toward the board,
  wherein the U-shaped curve part, the first contact part, and the second contact part link together in this recited order.

8. An electric connector comprising:
a housing; and
a plurality of contacts held by the housing, wherein
the plurality of contacts electrically connect a plurality of first conductors provided on an object and a plurality of second conductors provided on a board, respectively,
at least one contact of the plurality of contacts includes:
  a fixed part to be fixed to the housing;
  a soldering part to be soldered to a corresponding second conductor; and
  an elastic deformation part being a cantilever extending from the fixed part,
the elastic deformation part includes:
a first contact part configured to come into contact with a corresponding first conductor;
a second contact part being a cantilever extending from the first contact part toward the board;
a U-shaped curve part interposed between the first contact part and the fixed part; and
a third contact part, wherein:
the second contact part is configured to come into contact with the third contact part,
the first contact part, the second contact part, and the third contact part are configured such that, when the first contact part is not in contact with the first conductor, the second contact part is not in contact with the third contact part, and such that when the first contact part comes into contact with the first conductor and the elastic deformation part is elastically deformed, the second contact part comes into contact with the third contact part, and
a current path length from the first contact part to the soldering part through the second contact part and the third contact part is shorter than a current path length from the first contact part to the soldering part through the U-shaped curve part.

9. The electric connector according to claim 8, wherein
the U-shaped curve part has two spring pieces extending separately from each other in a pitch direction and parallel to each other and being connected at both ends,
the third contact part is a cantilever disposed between the two spring pieces in the pitch direction.

* * * * *